(12) United States Patent
Maruyama

(10) Patent No.: US 6,313,023 B1
(45) Date of Patent: Nov. 6, 2001

(54) METHOD OF FABRICATING DEFLECTION APERTURE ARRAY FOR ELECTRON BEAM EXPOSURE APPARATUS, WET ETCHING METHOD AND APPARATUS FOR FABRICATING THE APERTURE ARRAY, AND ELECTRON BEAM EXPOSURE APPARATUS HAVING THE APERTURE ARRAY

(75) Inventor: Shigeru Maruyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/329,631

(22) Filed: Jun. 10, 1999

(30) Foreign Application Priority Data

Jun. 11, 1998 (JP) .................................................. 10-163838
Jun. 23, 1998 (JP) .................................................. 10-176180

(51) Int. Cl.⁷ .................................................. H01L 21/44
(52) U.S. Cl. .............................. 438/597; 438/20; 438/32; 438/34; 438/745
(58) Field of Search ................................ 438/20, 32, 34, 438/597, 745, 753

(56) References Cited

FOREIGN PATENT DOCUMENTS

| 0 457 632 A | 11/1991 | (EP) . |
| 0 488 707 A | 6/1992 | (EP) . |
| 03104111 | * 5/1991 | (JP) . |
| 10056006 | * 2/1998 | (JP) . |

\* cited by examiner

*Primary Examiner*—Caridad Everhart
(74) *Attorney, Agent, or Firm*—Christie, Parker & Hale, LLP

(57) ABSTRACT

A method of fabricating a deflection aperture array used in an electron beam exposure apparatus and a wet etching method and apparatus for fabricating the deflection aperture array are disclosed. In wet etching an aperture array substrate, a jig is used for holding the substrate in such a manner that only a portion of the reverse side to be etched is exposed to an etching solution so that the surface protective film can be removed before wet etching. According to the wet etching method, a gas is introduced into or discharged from an enclosed spacing facing a non-etched surface thereby to adjust the internal pressure of the enclosed spacing. The internal pressure of the enclosed spacing is thus detected and held at a predetermined value in accordance with the detected pressure.

7 Claims, 19 Drawing Sheets

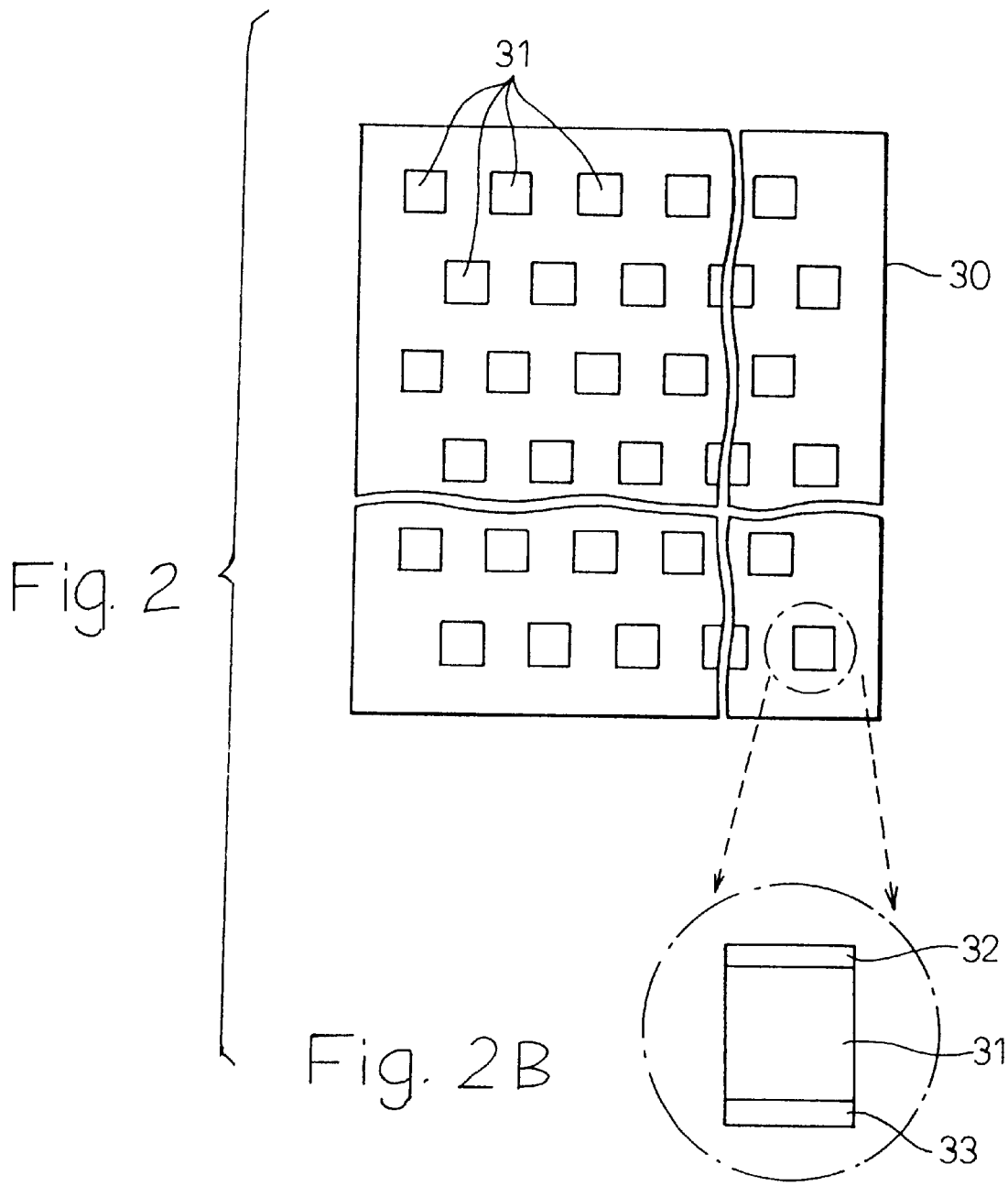

METHOD OF FABRICATING DEFLECTION APERTURE ARRAY FOR ELECTRON BEAM EXPOSURE APPARATUS, WET ETCHING METHOD AND APPARATUS FOR FABRICATING THE APERTURE ARRAY, AND ELECTRON BEAM EXPOSURE APPARATUS HAVING THE APERTURE ARRAY

BACKGROUND OF THE INVENTION

The present invention relates to a method of fabricating an aperture array used for splitting an electron beam into a multiplicity of child beams and deflecting the child beams independently of each other, a wet etching method and a wet etching apparatus for fabricating the aperture array, and an electron beam exposure apparatus of a blanking aperture array (BAA) type having the aperture array thus fabricated. In recent years, semiconductor technologies have developed to such an extent that the improvement in the integration degree and the functions of the semiconductor integrated circuits (IC) is expected to play a critical role in the progress of the technologies of the industries as a whole including the computer and the communication system control. The integration degree of ICs has quadrupled every two or three years. The storage capacity of the dynamic random-access memory (DRAM), for example, has increased from 1 M to 4 M to 16 M to 256 M to 1 G. This increased integration degree depends to a large measure on the progress of microfabrication technology for semiconductor fabrication.

Under the circumstances, the limit of the microfabrication technology is defined by the pattern exposure technology (lithography). Pattern exposure technology presently uses an optical exposure apparatus called a stepper. In the optical exposure apparatus, the minimum width of the pattern that can be formed is defined by the wavelength of the exposure light source due to the diffraction. At present, a light source for emitting the ultraviolet ray is used for the optical exposure apparatus. Nevertheless, it is difficult to use the light of a shorter wavelength than ultraviolet. For realizing more finely detailed microfabrication, therefore, a new exposure system, other than the optical exposure apparatus, has been under study.

In the electron beam exposure process, microfabrication on the order of 0.05 $\mu$m or less is known to be realized with an alignment accuracy of not more than 0.02 $\mu$m. The conventional electron beam exposure method, however, is lower than the stepper in throughput and has been considered impossible to use for mass production of LSIs. The invention in recent years of what is called the block exposure method (the partial pattern collective transfer method, in which repetitive patterns are exposed by collective transfer and the remaining patterns are exposed with variable rectangles) is expected to achieve a high throughput for devices such as memories involving many repetitive patterns. With logic devices or the like having a random pattern, however, the advantage of using the block exposure method is so low that an improved throughput is still difficult to achieve. Thus, the development is desired of an electron beam exposure method in which a high throughput exposure is possible for devices having a random pattern.

The conventional electron beam exposure method uses a single electron beam. Even the block exposure method requires the use of a single electron beam for a random pattern, and fails to achieve a sufficiently high throughput. Also, the application of the block exposure method to low-item-count multi-production devices requires a multiplicity of block patterns, and the increased number of block patterns limits the scope of application of the block exposure method. In view of this, an exposure method of a multi-beam type has been proposed in which the exposure is carried out by use of a plurality of independently controllable electron beams generated by a blanking aperture array (BAA). The present invention relates to a method of fabricating a BAA, a wet etching method and a wet etching apparatus for fabricating the BAA, and an electron beam exposure apparatus having the BAA thus fabricated. The exposure method of this type is called a blanking aperture array (BAA) method herein. The present invention, however, is not limited to a method of fabricating the BAA, a wet etching method and a wet etching apparatus for fabricating the BAA, and an electron beam exposure apparatus of BAA type, but is also applicable to any aperture array having an electrostatic deflector on the sides of each aperture of a substrate and a wet etching method and a wet etching apparatus for fabricating a substrate formed with through holes. In the description that follows, an electron beam exposure apparatus of a BAA type will be dealt with as an example.

In an electron beam exposure apparatus of a BAA type, the electron beam emitted from an electron gun is applied to a BAA device and converted into a multiplicity of fine beams each of which is controllable independently of each other. These fine beams are deflected by a main deflector and a subdeflector and radiated at a desired position on a specimen placed on a stage. At the same time, the fine beams are each focused into a small spot on the specimen by an electromagnetic lens. The fine beams are deflected to scan the specimen and each fine beam is turned on and off in synchronism with the deflection thereby to produce a desired exposure pattern. The electron beam exposure apparatus of BAA type, in addition to the advantage that an arbitrary pattern can be exposed freely, has another advantage in that the continuous change of the scan signal eliminates the time of setting up the beam required for the vector scan and therefore makes possible a high-efficiency exposure by a high-speed scan. Further, the same spot is exposed a plurality of times for a high exposure energy.

The BAA device is formed of a thin substrate such as a silicon wafer. The substrate has a multiplicity of apertures arranged two-dimensionally each having an electrostatic deflector. The electrostatic deflector is configured of a pair of parallel electrodes disposed on the two sides of each aperture on the substrate. The electron beam that has entered the BAA device is split into fine beams as it passes through the apertures. Each fine beam passes through the corresponding aperture and irradiates a specimen when no voltage is applied to the corresponding electrode pair. Upon application of a voltage between the electrode pair, on the other hand, an electric field is formed and the fine beam is deflected. The fine beam thus deflected is shut off by a restrictor and therefore is not radiated onto the specimen.

The block mask used in the block exposure method and the BAA device used in the BAA method are fabricated on a silicon (Si) wafer about 500 to 600$\mu$m thick. The fabrication process includes the step of partially etching the Si wafer to a thickness of several tens of $\mu$m. For this purpose, the wet etching method is used in which the Si wafer is dipped in an etching solution.

In the process for fabricating semiconductor devices, wet etching is widely used as well as dry etching, wet etching is so called because of its wetness. A recently-developed process for fabricating a highly integrated semiconductor device mainly uses dry etching. For semiconductor integrated circuits (IC) of a comparatively large size, however, wet etching is used for forming a pattern or boring holes in a dielectric layer. Wet etching is also used for MEMS (Micro-Electro-Mechanical Systems), i.e. the process of fabricating what is called a micromachine. In the conventional wet etching method, the Si wafer to be etched is dipped in an etching solution. When carrying out the wet etching, a silicon oxide film (hereinafter called simply the oxide film) or a silicon nitride film (hereinafter called simply the nitride film) is used as a mask (protective film) for protecting the non-etched portion. These films have a lower etching rate than Si, and as far as it is formed to a thickness considering the selective etching ratio with respect to Si, the non-etched portion is not exposed to the etching solution.

In the conventional method of fabricating a BAA device, a wiring pattern is formed on a substrate, a dielectric layer is formed on the assembly in such a manner as to cover the wiring pattern, a plurality of recesses corresponding to a plurality of apertures are formed in the substrate, a plurality of contact holes adjoining the recesses, respectively, are formed in the dielectric layer for exposing the wiring pattern, a conductive film pattern is deposited in such a manner as to cover a plurality of the contact holes on the dielectric layer, an electrode of an electrostatic deflector electrically connected to the wiring pattern is formed in each of the contact holes by plating with the conductive film pattern as an electrode, the reverse side of the assembly is removed to a predetermined position by wet etching, and then the conductive film is removed. In this case, the surface conductive film functions as a protective film so that only the reverse side is wet etched. After the wet etching process, the surface conductive film is required to be removed. A conductive film of tantalum molybdenum, for example, is etched off using $CF_4$ as an etching gas.

As the result of actual study conducted on the BAA device fabricated by the method described above, it has been found that the lower surface of the substrate is fouled and damaged by impurities. These defects are considered to derive from the fluoride formed by the reaction between the $CF_4$ etching gas and $SiO_2$ used as a specimen holder of the etching apparatus in the process of etching off the conductive film. In the case where a BAA device having these defects is arranged in an electron beam exposure apparatus, a charge-up is liable to occur in the defective portions, thereby leading to the problem that such defects as a distortion and a deformation develop in the exposed pattern. Thus, a method of fabricating a BAA device free of such defects is desired. It is also desired to improve the fabrication efficiency by improving the low efficiency of etching off the conductive layer using the CF, etching gas.

SUMMARY OF THE INVENTION

A first object of the present invention is to realize a method of fabricating a BAA device free of defects on the surface of an aperture array substrate.

A second object of the invention is to realize a wet etching method and a wet etching apparatus suitable for a very thin substrate such as an aperture array substrate.

According to a first aspect of the invention, there is provided a method of fabricating an aperture array substrate in which an aperture array substrate of a BAA device or the like is wet etched using a jig for holding the substrate in such a manner that only a portion of the reverse side to be etched is exposed to an etching solution, thereby removing the surface protective film before carrying out the wet etching. As a result, when etching off the conductive layer using $CF_4$ after wet etching, the fouling due to impurities and the resulting defects are prevented which otherwise might be caused on the lower surface of the substrate. Even in the case where this method is used for an electron beam exposure apparatus, therefore, the problem of charge-up is avoided.

Specifically, according to the invention, there is provided a method of fabricating an aperture array substrate formed with an electrostatic deflector corresponding to each of a plurality of apertures formed in an array on the substrate, comprising the steps of forming a wiring pattern on the substrate, forming a dielectric layer in such a manner as to cover the wiring pattern on the substrate, forming a plurality of recesses corresponding to a plurality of the apertures, respectively, in the substrate, forming a plurality of contact holes for exposing the wiring pattern in the insulating film adjacently to a plurality of the recesses, respectively, depositing a conductive film pattern on the dielectric layer in such a manner as to cover a plurality of the contact holes on the substrate, forming an electrode of an electrostatic deflector electrically connected to the wiring pattern in each of the contact holes by plating with the conductive film as an electrode, removing the conductive film, and removing a portion of the reverse side of the substrate to a predetermined position by wet etching except for another portion of the reverse side.

The wet etching step is carried out by holding the substrate with a protective jig covering the substrate except for a portion of the reverse side of the substrate and dipping the substrate in an etching solution. The protective jig has a body portion formed with a recess. The substrate is mounted on the protective jig in such a manner that the dielectric layer faces and encloses the recess of the protective jig. In this way, the substrate is covered except for a portion of the reverse side thereof. Further, the protective jig includes a seal member arranged on the edge portion of the recess for surrounding the recess and a holding member having an opening for exposing a portion of the reverse side of the substrate and engaged with the body portion with the substrate pressed against the seal member.

Further, according to this invention, the conductive film is removed before the wet etching step. The step of removing the conductive film, therefore, can be executed by an ion milling process.

The method according to the invention is applicable to the fabrication of the blanking aperture array (BAA) used for an electron beam exposure apparatus, in which case a silicon substrate is desirably used. Also, the present invention is applicable to the fabrication of any device other than BAA to the extent that a multiplicity of apertures are formed in a thin substrate and an electrode is formed on the substrate in a way corresponding to each aperture.

In fabricating an aperture array by the method according to the invention, the air is hermetically contained between the protective jig and the wafer surface protected by the protective jig in order to keep off the etching solution. The etching solution is heated and used at a temperature considerably higher than the room temperature in order to improve the etching rate. When the protective jig having the wafer mounted thereon is placed into or taken out of the etching solution, therefore, the air pressure in the enclosed spacing undergoes a great change due to sudden expansion and contraction of the air in the enclosed spacing. In the case of the aperture array, a portion of the substrate is fabricated as a very thin layer and partially formed with a through hole. It has been found that the change in air pressure exerts a large force on the wafer surface and may break the wafer.

In view of this, in a wet etching method and a wet etching apparatus according to this invention, a gas is introduced into or discharged from the closed spacing facing the non-etched surface. In this way, the pressure in the enclosed spacing can be regulated. Also, the internal pressure of the enclosed spacing is detected, and in accordance with the detected pressure, the pressure in the enclosed spacing is held at a predetermined value.

According to a second aspect of the invention, the internal pressure of the enclosed spacing between the mechanism and the surface of the workpiece to be protected can be freely controlled. While in the etching solution, for example, the interior of the assembly is maintained at a pressure equal to the liquid pressure, so that the pressure increase (or decrease) due to the thermal expansion (or contraction) resulting from liquid temperature changes can be alleviated. As a result, the wafer is prevented from breaking under a pressure change in the enclosed spacing.

Further, the configuration described above can have the function of detecting the final point of etching. A workpiece or an object equivalent to and mounted in the same way as the workpiece is provided with a portion as thick as or slightly thicker than the etching thickness. Then, the instant the Si wafer is formed with a through hole with the progress of etching, the etching process is terminated. The pressure in the enclosed spacing should sharply drop the moment the through hole is opened in the Si wafer. Thus, the internal pressure of the enclosed spacing is monitored during the etching process, and upon detection of a sharp pressure drop, the assembly is taken out of the processing solution. Actually, however, the etching cannot necessarily proceed uniformly over the whole surface of the wafer, and therefore over etching is necessary. This configuration prevents excessive over-etching and makes it possible to accurately estimate the optimum etching time.

Further, the internal pressure of the enclosed spacing is kept slightly higher than the pressure of the etching solution. Should the over etching consume too much time, the etching solution is kept out of the enclosed spacing, and therefore the protected surface is not damaged by the etching solution.

In a modification of the method and apparatus for wet etching according to the second aspect of the invention, the enclosed spacing faced by the non-etched surface is connected to the exterior of the etching solution.

According to this modification, even in the case where the mechanism with the workpiece mounted thereon is placed into or taken out of a high-temperature etching solution, the interior of the enclosed spacing is always kept under the same pressure as the exterior of the etching solution. The wafer is thus prevented from breaking which otherwise might occur due to the pressure change in the enclosed spacing.

BRIEF DESCRIPTION OF THE DRAWINGS

The present invention will be more clearly understood from the description as set forth below with reference to the accompanying drawings, wherein:

FIG. 2 is a diagram showing an example of BAA;

DESCRIPTION OF THE PREFERRED EMBODIMENTS

Before proceeding to the detailed description of the preferred embodiments, a prior art production method of the BAA device will be described with reference to the accompanying drawings for a clearer understanding of the difference between the prior art and the present invention.

Figure 1:
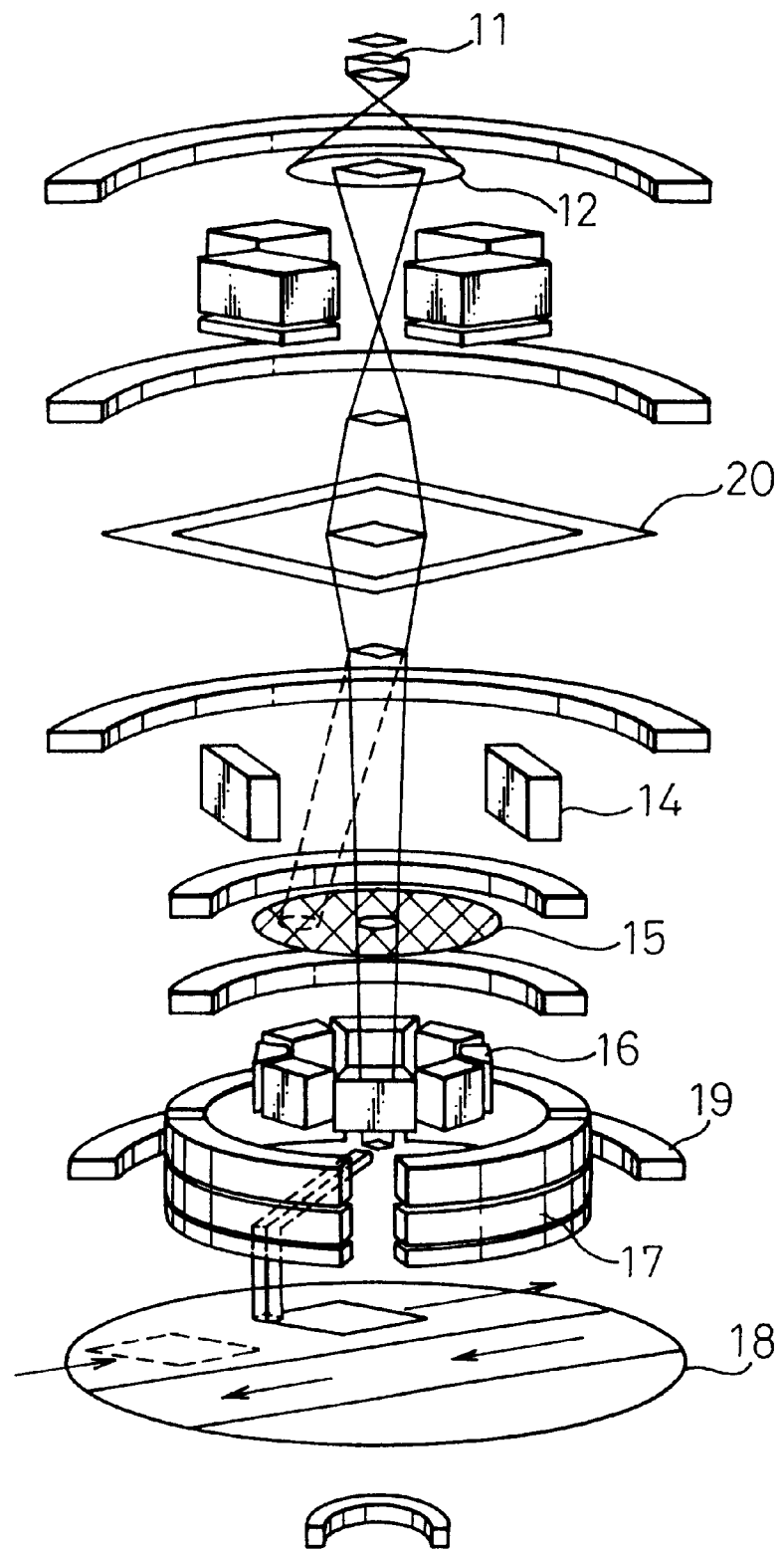
FIG. 1 is a diagram showing an example configuration of an electron optic system of an electron beam exposure apparatus of blanking aperture array (BAA) type.

FIG. 1 is a diagram showing a basic configuration of an optical system of an electron beam exposure apparatus of a BAA type. In FIG. 1, the electron beam emitted from an electron gun 11 is shaped in a first rectangular aperture 12 and after being converted into parallel beams by an electromagnetic lens or the like, enters a BAA device 20. As described later, the electron beam that has entered the BAA device 20 is converted into a multiplicity of fine beams each of which is independently controllable as to the possibility of being radiated on a specimen (wafer). A blanker 14 is an electrostatic deflector for deflecting and simultaneously shutting off (turning off) a multiplicity of the fine beams that have passed through the BAA device 20. The fine beams are thus turned off by a final aperture 15 when deflected. The beams, when not deflected, pass through the final aperture as they are and therefore are turned on. A multiplicity of the fine beams that have passed through the final aperture 15 are deflected by a subdeflector 16 and a main deflector 17 and irradiated onto a desired position on a specimen (wafer) 18 placed on a stage. At the same time, a multiplicity of beams are each focused into a small spot on the specimen 18 by an electromagnetic lens (configured of a coil shown and a pole piece not shown) 19. The component elements described above are encased in a housing called an optical column which contains a vacuum in the portion where the electron beams pass.

The actual electron beam exposure apparatus also includes, though not shown in FIG. 1, an exposure control circuit for generating a signal to be applied to each electrode of the BAA device 20 in accordance with the exposure pattern and a deflection signal to be applied to the subdeflector 16 and the main deflector 17, a drive circuit for applying the signals generated from the exposure control circuit to various parts, and an electronic control circuit such as a stage control circuit for controlling the movement of the stage.

Now, the principle of the blanking aperture array (BAA) system will be explained with reference to FIGS. 2 and 3. FIG. 2 is a diagram showing an example configuration of a BAA unit 30 including a BAA of the BAA device 20. The BAA unit 30 is configured of a thin plate having a multiplicity of apertures 31 each having a deflection signal electrode (deflection electrode) 32 and a ground potential electrode (GND electrode) 33 arranged on both sides thereof as shown. A uniform electron beam is applied to the BAA unit 30 thereby to generate a multiplicity of fine beams passing through the respective apertures 31. In the process, an electrostatic deflector is formed of the electrodes 32, 33. When no voltage is applied to the electrode 32, the corresponding fine beam passes through the aperture and is irradiated onto the wafer 18. When a voltage is applied to the electrode 32, in contrast, the corresponding fine beam is changed in direction and not radiated on the wafer 18. In other words, a beam passing through the corresponding aperture 31 can be turned on and off according to whether a voltage is applied to the electrode 32 or not. For the present purpose, the state in which a voltage is applied to the electrode 32 so that the corresponding fine beam is deflected and not radiated on the wafer 18 is assumed to be the off state, whereas the state in which a voltage is not applied to the electrode 32 so that the fine beam is radiated on the wafer 18 without being deflected is assumed to be the on state.

Figure 3A:
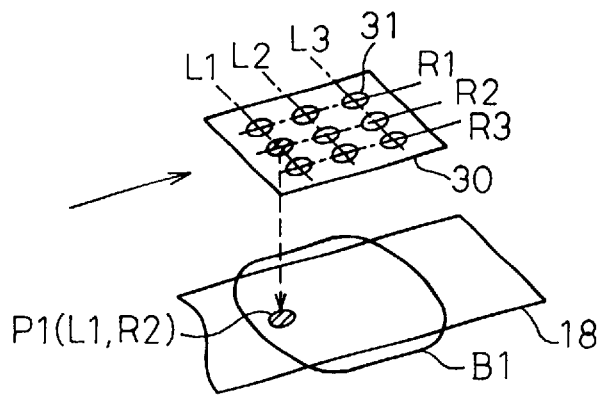
FIGS. 3A to 3C are diagrams for explaining the exposure in the BAA system.
Figure 3B:
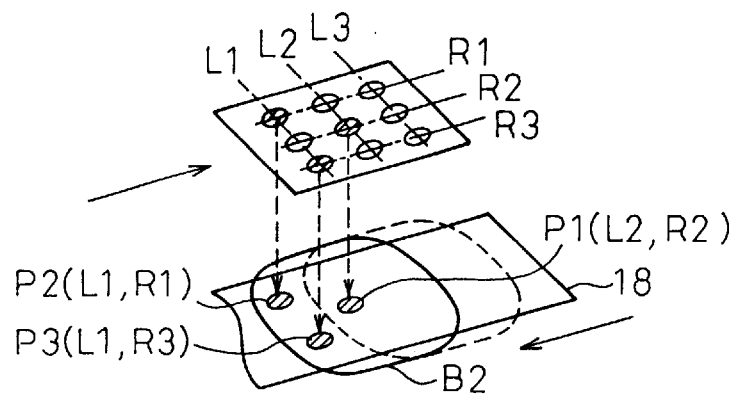
Figure 3C:
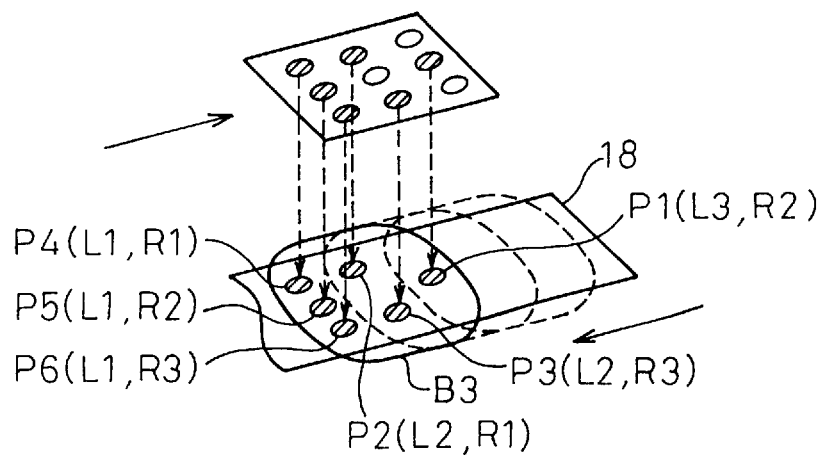

In the exposure process of the BAA system, a desired exposure pattern can be obtained by controlling the on-off state of each aperture of the BAA unit 30 in synchronism with the deflection of the fine beams. FIG. 3 is a diagram for explaining the exposure in the BAA system, in which the BAA unit 30 has nine apertures arranged in three columns and three rows. First, as shown in FIG. 3A, the beams that have passed through the BAA unit 30 are deflected in such a manner as to be radiated at the position B1. In the process, assume that only the aperture (L1, R2) is on and the other apertures are off. The beam that has passed through the aperture (L1, R2) is radiated at the position P1 (L1, R2) on the specimen 18. Then, the scanning process slightly proceeds and, as shown in FIG. 3B, the beams that have passed through the BAA unit 30 are deflected in such a manner as to be radiated at the position B2. Assume that only the apertures (L2, R2), (L1, R1), (L1, R3) are on, while the other apertures remain off. Only the beams that have passed through the apertures (L2, R2), (L1, R1), (L1, R3) are radiated at the positions P1 (L2, R2), P2 (L1, R1), P3 (L1, R3), respectively. In the process, assume that the amount of deflection between FIGS. 3A and 3B is such that P1 (L2, R2) has occupied the same position as P1 (L1, R2). With the further progress of the scanning process, the beams that have passed through the BAA unit 30 are deflected to be radiated at the position B3 as shown in FIG. 3C. In this case, assume that the apertures (L3, R2), (L2, R1), (L2, R3), (L1, R1), (L1, R2), (L1, R3) are on, while the other apertures are off. Only the beams that have passed through the former apertures are radiated at the positions P1 (L3, R2), P2 (L2, R1), P3 (L2, R3), P4 (L1, R1), P5 (L1, R2), P4 (L1, R3) on the specimen 18. In the process, assume that the amount of deflection between FIGS. 3B and 3C is such that the P1 (L3, R2) has changed to come to occupy the same position as P1 (L2, R2), P2 (L2, R1) the same position as P2 (L1, R1), and P3 (L2, R3) the same position as P3 (L3, R3).

Then, though not shown, the pattern of column L2 in FIG. 3C is transferred to L1, the pattern of column L1 is transferred to L2, and a new pattern is added to column L1, while at the same time proceeding with the scanning process. This operation permits an arbitrary pattern to be exposed with the row width of the apertures of the BAA unit 30 within the length of the scanning range. At the same time, each spot is exposed by an amount equal to the number of the aperture columns. The apertures 21 in FIG. 2 are arranged in staggered form. By scanning along the vertical direction in FIG. 2, the spacings between the spots on each row are filled up thereby to assure a uniform exposure.

As described above, the BAA system has the dual advantage that an arbitrary pattern can be freely exposed and that, for lack of the beam setting time required for the vector scanning, a high-speed scan is possible, leading to a high-efficiency exposure. Further, since the same spot is exposed a plurality of times, the exposure energy is high.

Generally, the response speed of the subdeflector is higher than that of the main deflector. Normally, therefore, the main deflection range of the main deflector is segmented into a plurality of subdeflection ranges smaller than the deflection range of the subdeflector. After thus setting the deflection position of the main deflector at the center of each subdeflection range, the deflection position of the subdeflector in the subdeflection range is changed while carrying out the pattern exposure. Upon complete exposure of a given subdeflection range, the deflection position of the main deflector is changed for carrying out the exposure of the next subdeflection range. A continuous movement method is also available in which the stage is moved continuously while carrying out the exposure. In this case, the deflection position of the main deflector is changed in synchronism with the movement of the stage while at the same time sequentially exposing in the subdeflection range.

Figure 4:
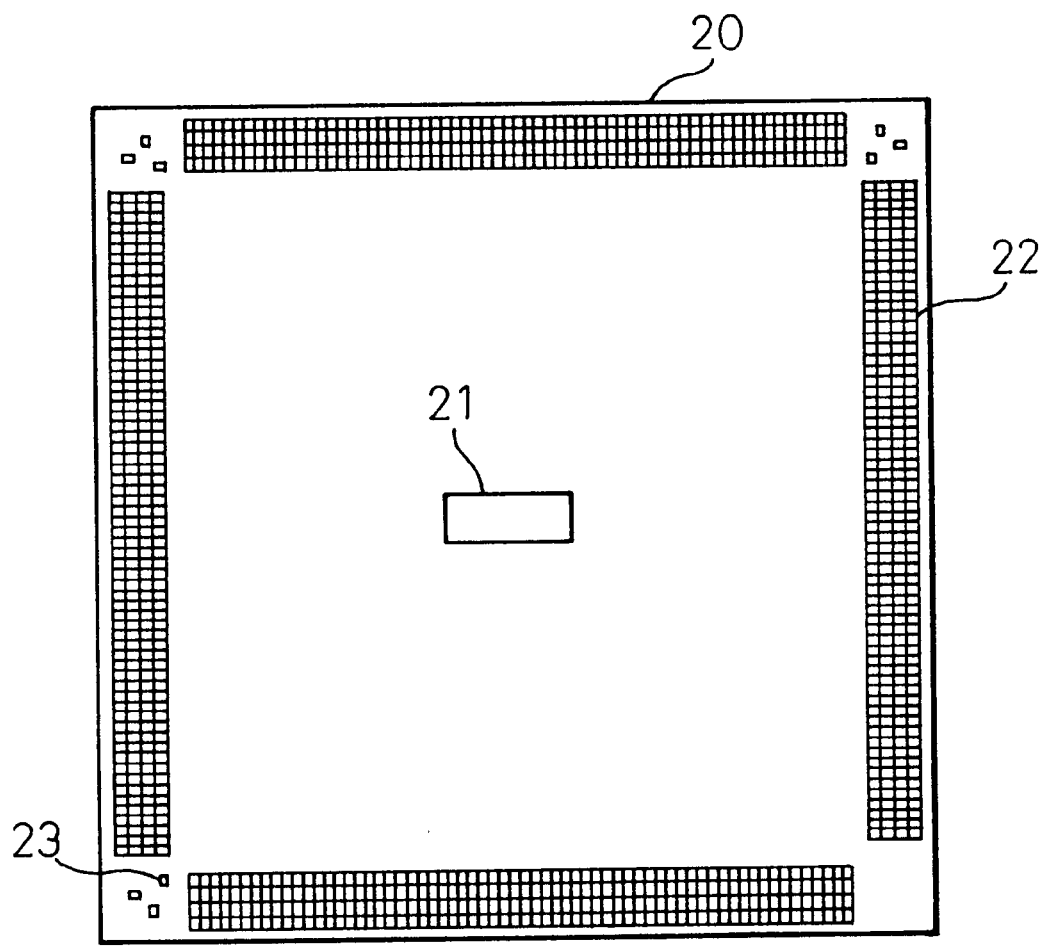
FIG. 4 is a general view showing an actual BAA device.

Now, the actual BAA device 20 will be explained. FIG. 4 is a diagram showing a general configuration of the BAA device 20, FIG. 5 is an enlarged view of the aperture portion of the BAA device 20, and FIG. 6 is a sectional view of the BAA device 20 illustrating two apertures alone.

As shown in FIG. 4, the BAA device 20 is formed of a thin plate such as a silicon wafer, for example, and formed with a central aperture portion 21 thinned by etching or the like. Reference numeral 22 designates a deflection electrode pad for the deflection signal applied to the deflection electrode of each aperture, and numeral 23 designates a GND electrode pad connected to a GND electrode.

Figure 5:
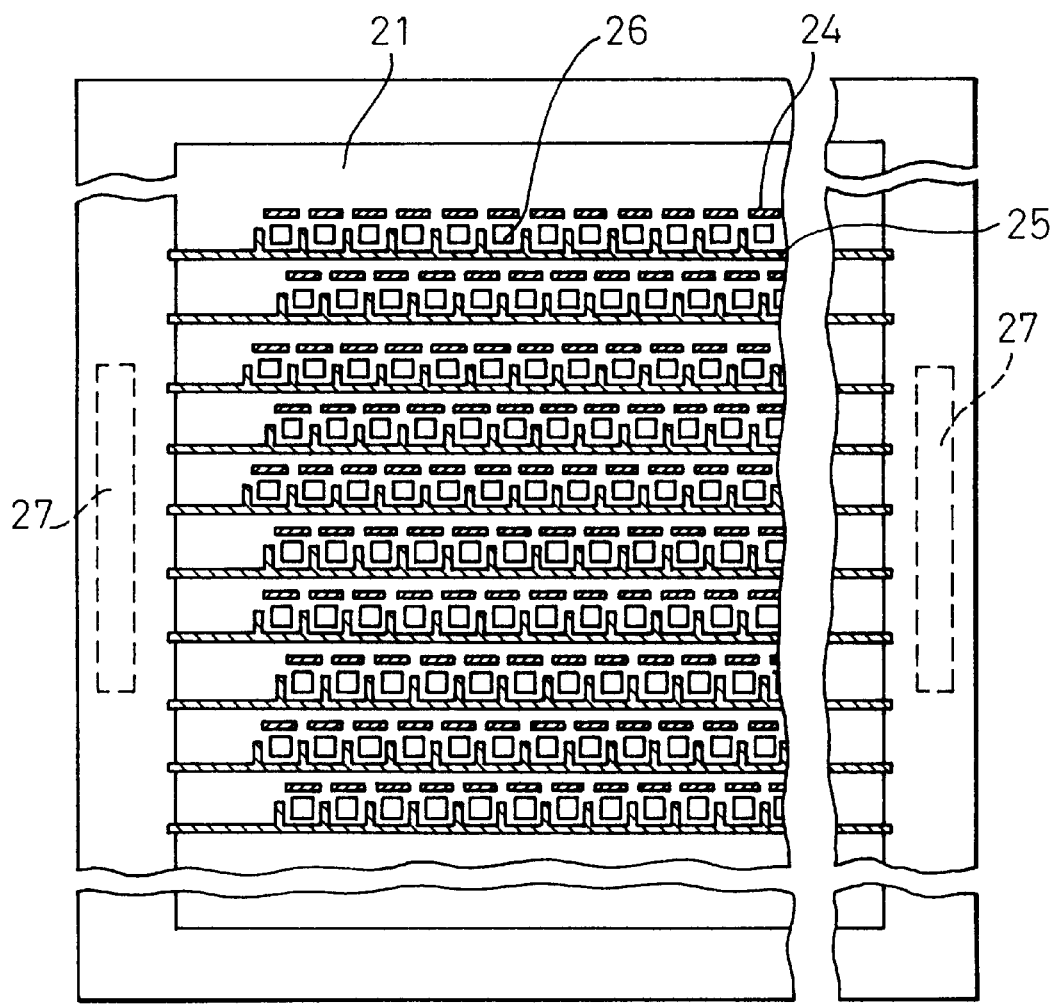
FIG. 5 is a detailed diagram showing an aperture portion of an actual BAA device.

As shown in FIG. 5, the aperture portion 21 has apertures 26 formed in alignment at a predetermined pitch in horizontal direction and in a manner staggered by half pitches alternately in vertical direction. The apertures 26 number 512, for example. A deflection electrode 24 is arranged on the upper side of each aperture 26, and a GND electrode 25 is arranged on each of the remaining three sides. The GND electrodes 25 are connected laterally to each other. This electrode structure is used in order to prevent the voltage applied to the deflection electrode 24 of each aperture from affecting the other apertures. Reference numeral 27 designates a through hole for wiring between the GND electrodes 25 and the GND electrode pads 23.

Figure 6:
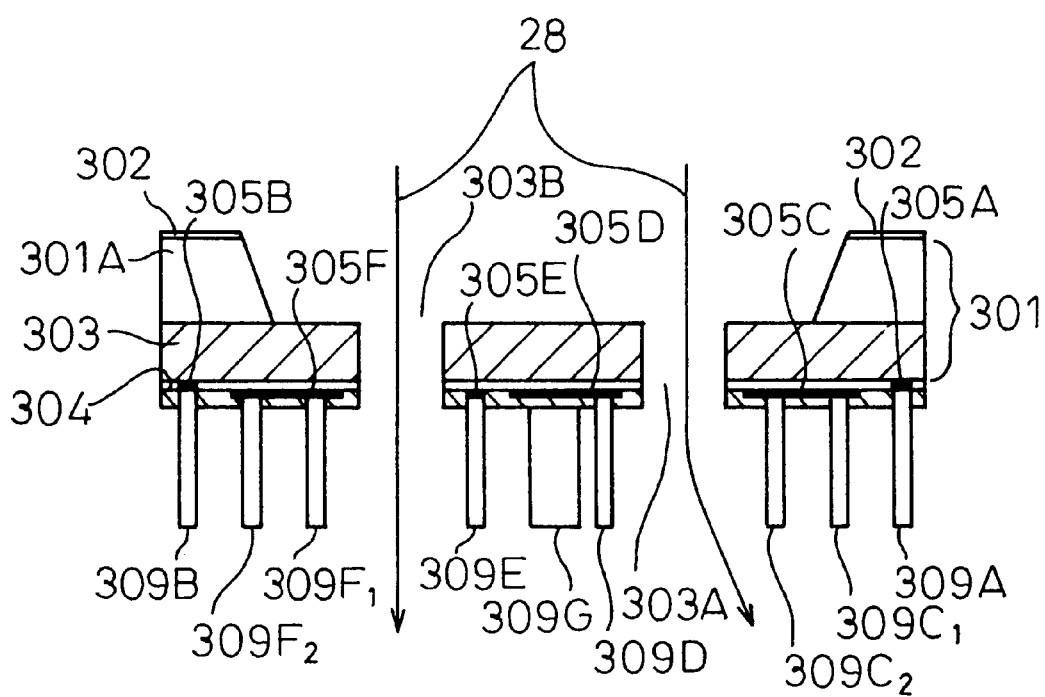
FIG. 6 is a sectional view of a BAA device.

As shown in FIG. 6, the BAA device 20 comprises a silicon (Si) substrate 301 having the aperture portion 21 thinned further by etching and formed with apertures 303A, 303B, and deflection electrodes 309A, 309B, 309C$_1$, 309C$_2$, 309D, 309E, 309F$_1$, 309F$_2$ formed on the substrate around the apertures. The electron beam 28 enters the apertures 303A, 303B and split into fine beams. Upon application of a voltage between the deflection electrodes 309C$_1$ and 309C$_2$, the fine beam that has passed through the aperture 303A is deflected and is not radiated on the specimen as it is shut off by a restrictor. In other words, the fine beam is turned off. On the other hand, no voltage is applied between the deflection electrodes 309F$_1$ and 390F$_2$, and therefore the fine beam that has passed through the aperture 303B is radiated on the specimen without being deflected. In other words, this fine beam is turned on.

Figure 7A:
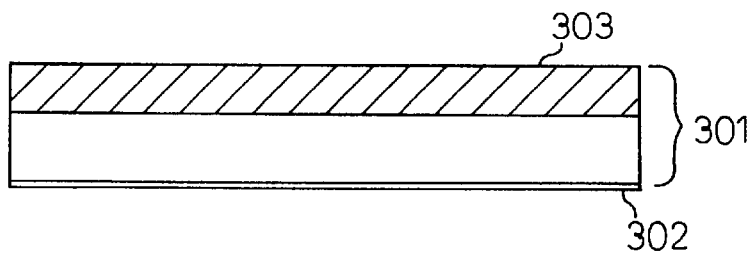
FIGS. 7A to 7N are diagrams showing the steps of fabricating a BAA device according to a conventional method.
Figure 7B:
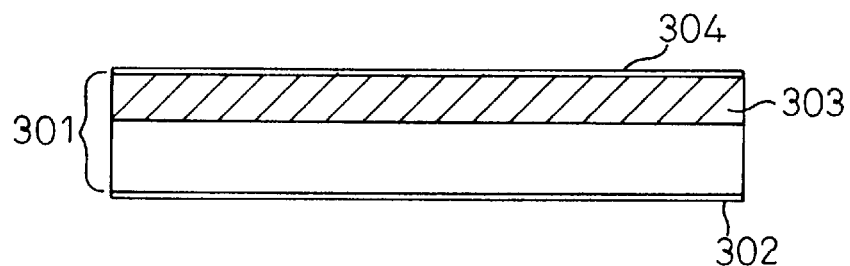
Figure 7C:
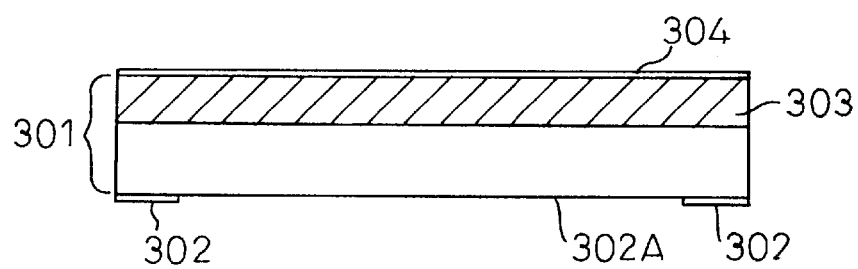
Figure 7D:
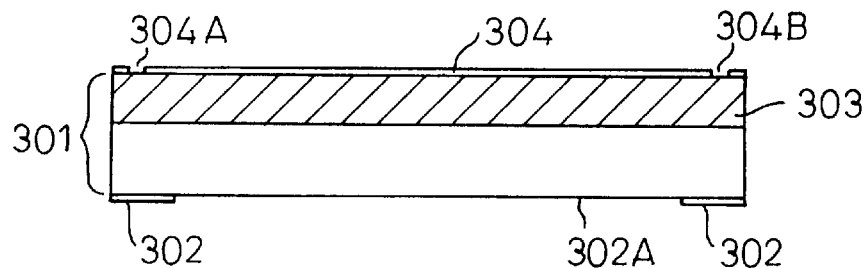
Figure 7E:
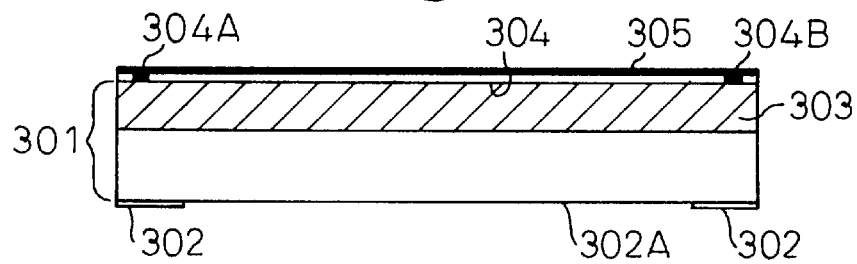
Figure 7F:
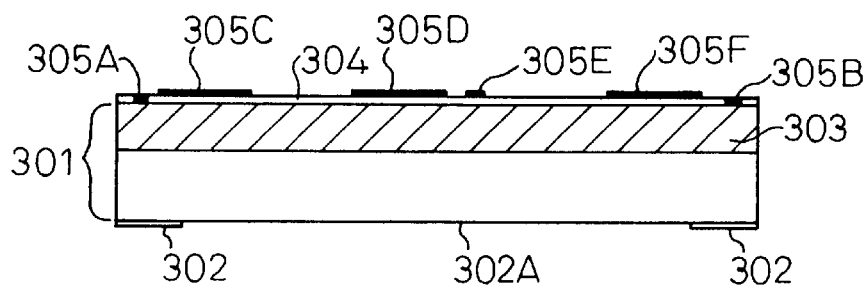
Figure 7G:
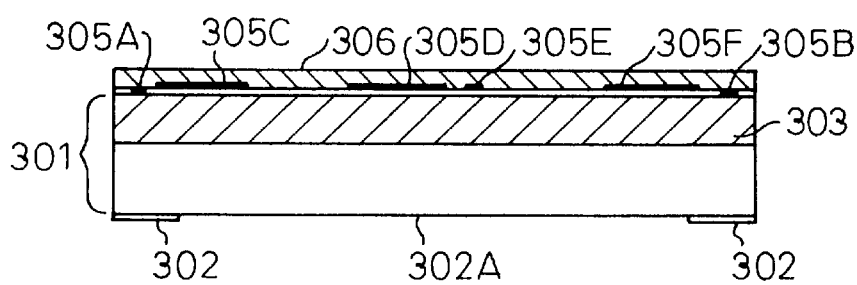
Figure 7H:
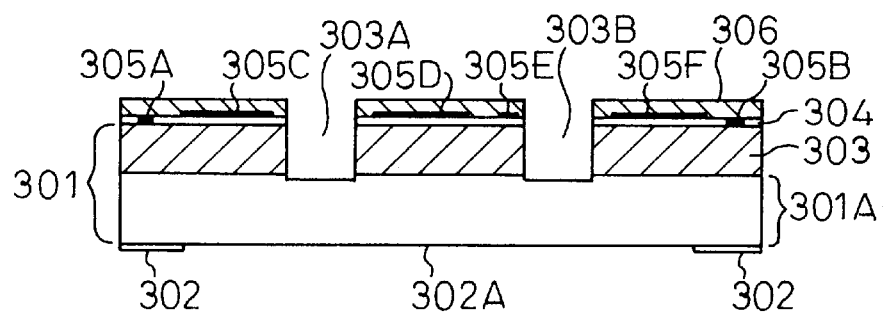
Figure 7I:
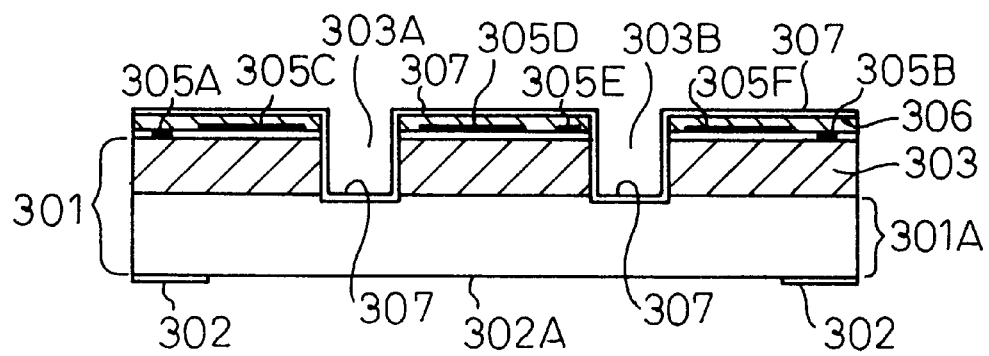
Figure 7J:
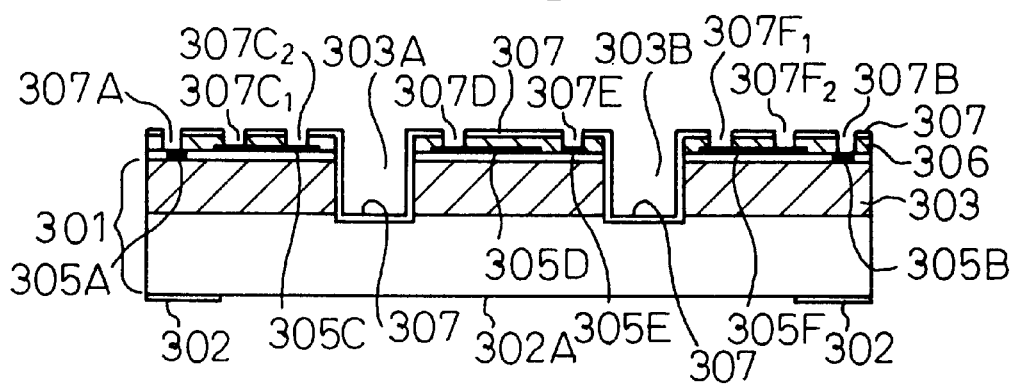
Figure 7K:
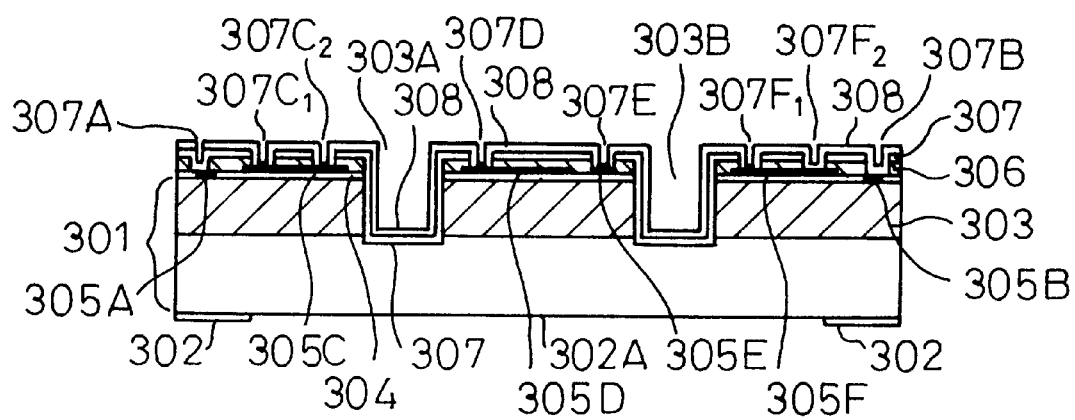
Figure 7L:
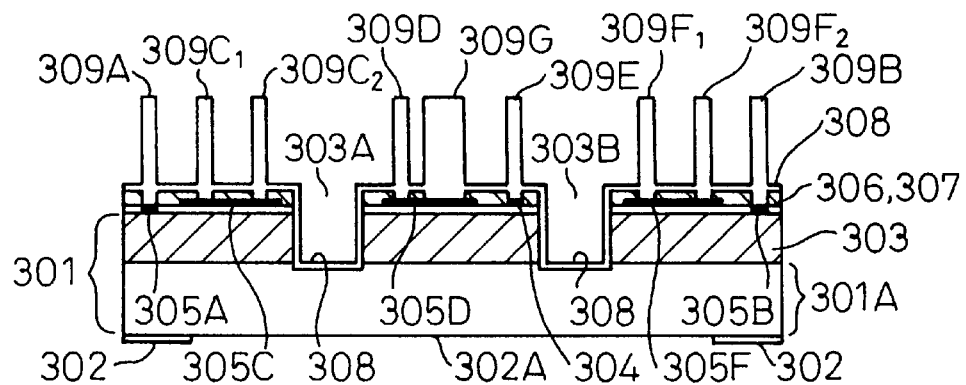
Figure 7M:
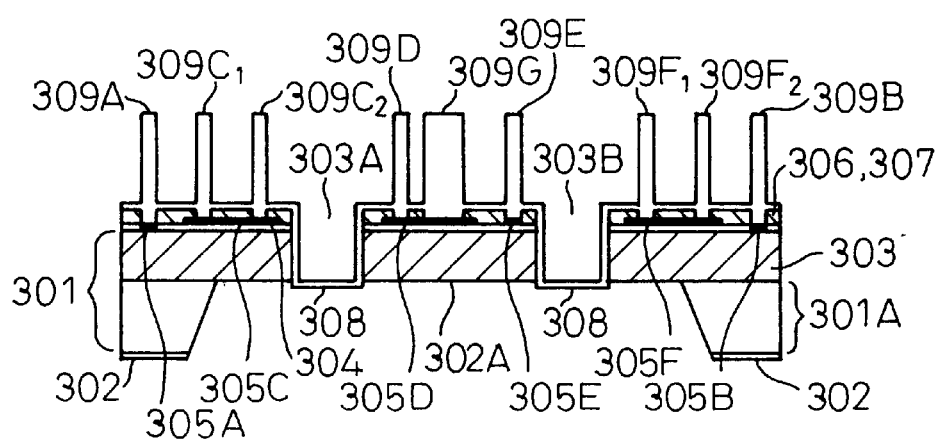
Figure 7N:
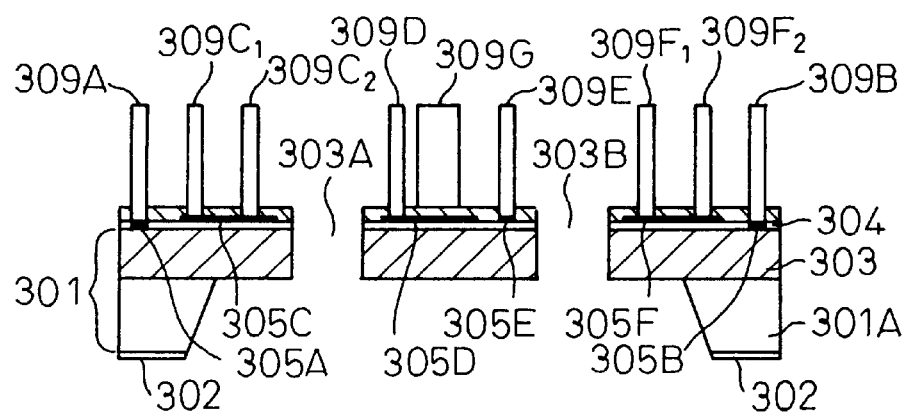

FIGS. 7A to 7N are diagrams showing a conventional method of fabricating a BAA device. As shown in FIG. 7A, the surface of a Si substrate 301 formed with a thermal oxide SiO$_2$ film 302 having a thickness of about 700 nm on the bottom thereof is formed with a B dope 303 having a thickness of about 20 $\mu$m containing boron B having a concentration of about $10^{20}$ cm$^{-3}$ by doping boron B. Further, in the step of FIG. 7B, the surface of the B diffusion layer 303 is formed with a thermal oxide SiO$_2$ film 304 having a thickness of about 700 nm, and in the step of FIG. 7C, an aperture 302A for exposing the bottom of the Si substrate 301 is formed in the thermal oxide SiO$_2$ film 304 on the bottom of the Si substrate 301 in a way corresponding to the aperture portion 21 of the BAA device 20.

Then, in the step of FIG. 7D, contact holes 304A, 304B for exposing the B diffusion layer 303 in the Si substrate 301 are formed in the thermal oxide SiO$_2$ film 304 on the upper surface of the Si substrate 301. Further, in the step of FIG. 7E, a conductive layer 305 is deposited in such a manner as to bury the contact holes 304A, 304B.

Further, in the step of FIG. 7F, the conductive layer 305 is patterned typically by the ion milling process, thereby forming ground electrodes 305A, 305B electrically connected with the B diffusion layer 303 in a way corresponding to the contact holes 304A, 304B, respectively. As the result of patterning the conductive layer 305, wiring patterns 305C to 305F are formed on the thermal oxide SiO$_2$ film 304.

In the step of FIG. 7G, a SiO$_2$ film 306 is formed by the plasma CVD method in such a manner as to cover the ground electrodes 305A, 305B and the wiring patterns 305C to 305F on the structure of FIG. 7F. Further, in the step of FIG. 7H, recesses 303A, 303B corresponding to the apertures are formed through the SiO$_2$ films 306 and 304 by dry etching in such a manner as to reach the non-doped region 301A of the Si substrate 301. The depth of the recesses is 25 $\mu$m, for example. In the shown case, the recess 303A is formed between the wiring patterns 305C and 305D, and the recess 303B is formed between the wiring patterns 305E and 305F.

In the step of FIG. 7H, the dry etching process for forming the recesses 303A, 303B includes the substep of first patterning the plasma CVD SiO$_2$ film 306 and the underlying thermal oxide SiO$_2$ film 304 by the RIE (reactive ion etching) method using a resist pattern and then forming apertures corresponding to the recesses 303A, 303B in the SiO$_2$ films 306 and 304, and the substep of etching the B doped Si layer 303 under the SiO$_2$ film 306 formed with the apertures, with the latter film as a mask, by the RIE method using the chlorine gas Cl$_2$ as an etching gas. As a result, the recesses 303A, 303B are formed.

The substep of etching the B doped Si layer 303 is substantially terminated at the instant the non-doped region 301A is exposed in the bottom of the recesses 303A, 303B.

When etching the Si layer in the step of FIG. 7H, the thickness of the SiO$_2$ film 306 is also reduced. In the step of FIG. 7I, therefore, a SiO$_2$ film 307 is additionally formed. In the case where the thickness of the SiO$_2$ film 306 is sufficiently large, the step of FIG. 7I can be done without. In such a case, the total thickness of the dielectric films 306 and 307 is about 1000 nm.

Then, in the step of FIG. 7J, the SiO$_2$ films 306, 307 are patterned, so that apertures 307A, 307B and apertures 307C$_1$, 307C$_2$, 307D, 307E, 307F$_1$, 307F$_2$ are formed for exposing the ground electrodes 305A, 305B and the wiring patterns 305C to 305F, respectively. Further, in the step of FIG. 7K, a TaMo film, a Au film and a TaMo film are deposited by vacuum evaporation sequentially on the structure of FIG. 7J, so that a conductive layer 308 is brought into contact with the SiO$_2$ film 307 and the ground electrodes 305A, 305B and the wiring patterns 305C to 305F in the apertures 307A, 307B, 307C$_1$, 307C$_2$, 307D, 307E, 307F$_1$, 307F$_2$.

Then, in the step of FIG. 7L, a resist pattern is formed on the structure of FIG. 7K, and by electrolytic plating Au with the conductive layer 308 as an electrode, deflection electrodes 309A, 309B, 309C$_1$, 309C$_2$, 309D, 309E, 309F$_1$, 309F$_2$ are formed in electrical and physical contact with the electrodes 305A, 305B or the wiring patterns 305C to 305F. These deflection electrodes correspond to the ground electrode 25 or the drive electrode 24 described above. Under the condition of FIG. 7L, the surface of the SiO$_2$ film 307 including the side walls and bottom surfaces of the recesses 303A, 303B is continuously covered by the conductive layer 308.

Then, in the step of FIG. 7M, the structure of FIG. 7L is dipped in an etching solution (EPW) consisting of a mixture of ethylenediamine, pyrocatechol and water, so that the portion of the Si substrate 301 exposed by the aperture 302A of the underlying thermal oxide SiO$_2$ film 302 is removed by wet etching. The wet etching process is substantially terminated at the time point when the B diffusion layer 303 is exposed in the substrate 301 thereby to produce the structure shown in FIG. 7M. In view of the fact that the front surface of the substrate 301, i.e. the surface of the SiO$_2$ film 307 is covered continuously by the conductive layer 308 and therefore is protected against the etching solution. As the result of the step in FIG. 7M, the aperture portion 21 of the BAA device is formed by the B diffusion layer 303.

Further, in the step of FIG. 7N, the structure of FIG. 7M is subjected to RIE in the direction substantially perpendicular to the main surface of the substrate 301, thereby removing the conductive layer 308 from the surface of the SiO$_2$ film 307 and from the bottom of the recesses 303A, 303B. As a result, on the SiO$_2$ film 307, the deflection electrodes 309A, 309B, 309C$_1$, 309C$_2$, 309D, 309E, 309F$_1$, 309F$_2$ become independent of each other, and the recesses 303A, 303B are formed with apertures. In the RIE process of FIG. 7N, TaMo is etched using CF$_4$ as an etching gas.

Figure 8A:
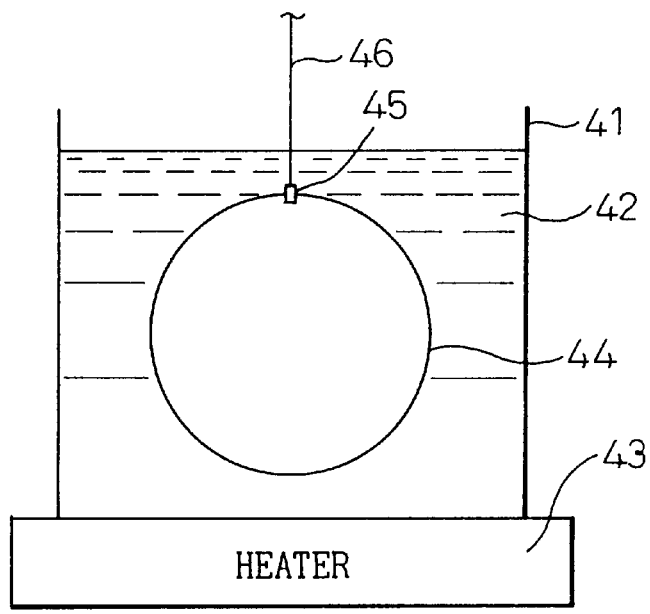
FIGS. 8A and 8B are diagrams showing a conventional wet etching method.
Figure 8B:
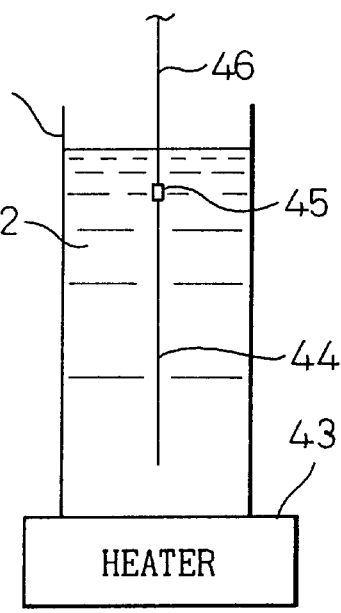

The wet etching process is carried out in the step of FIG. 7M. FIGS. 8A, 8B are diagrams for explaining an example of the conventional wet etching method. As shown in FIGS. 8A, 8B, an etching solution 42 is filled in an etching bath 41. A Si wafer 41 to be etched is suspended by a wire with a clamp 45 and dipped into the etching solution 42. In the wet etching process, the etching solution 42 is required to be heated in order to shorten the processing time. For this purpose, a heater 43 is arranged under the etching bath 41. In the case where the wet etching process is carried out according to this method, a silicon oxide (hereinafter referred to simply as the oxide film) or a silicon nitride film (hereinafter called simply as the nitride film) is used as a mask (protective film) for protecting the non-etched portion. These films have an etching rate lower than Si, and if formed to the thickness taking the selective etching ratio with Si into consideration, the non-etched portion is not exposed to the etching solution. Also in the step of FIG. 7M, the wet etching process is executed in the manner shown in FIGS. 8A, 8B. In this case, the conductive layer 308 functions as a mask.

Figure 19:
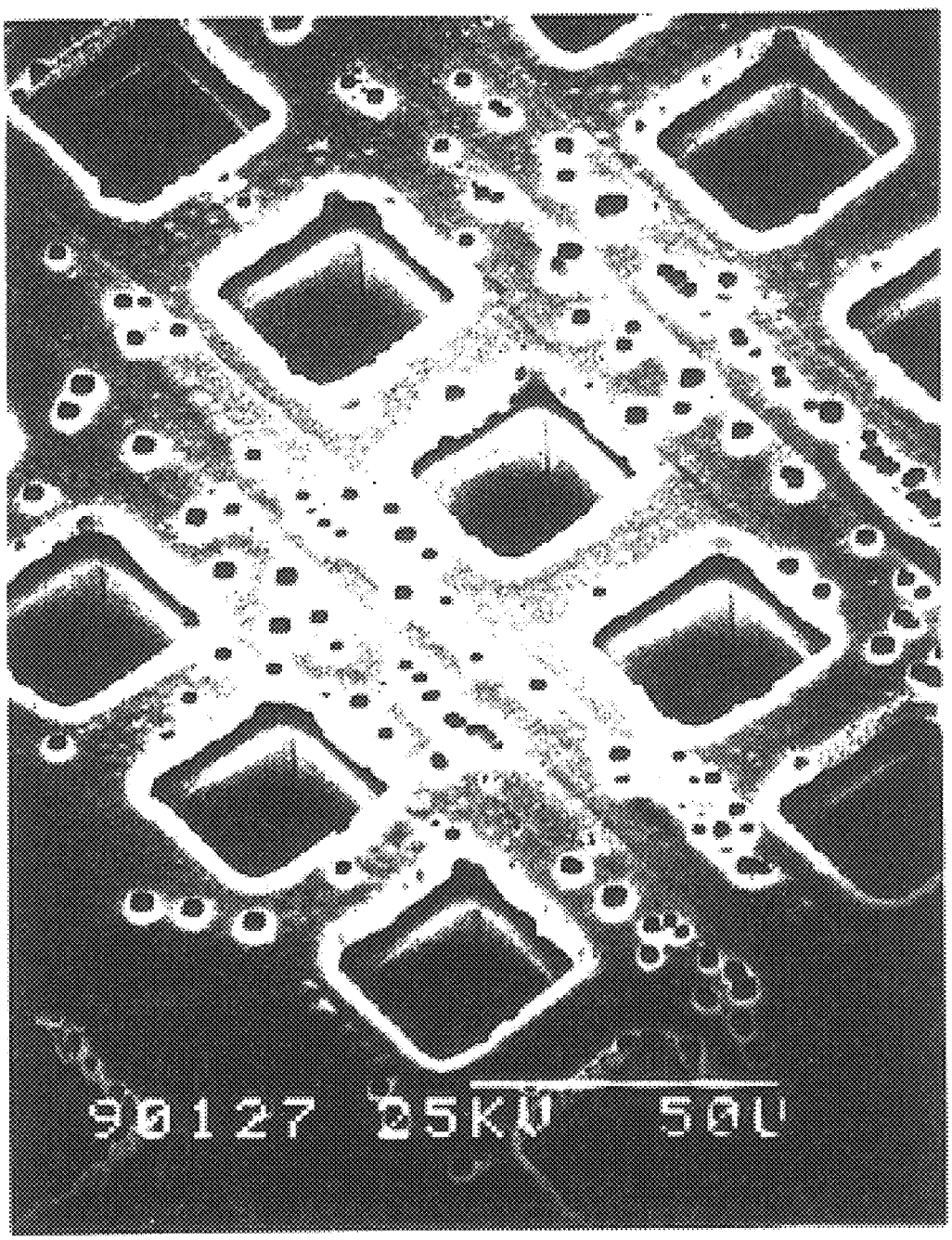
FIG. 19 is an electron micrograph showing the lower surface of an aperture portion.

In the case where the BAA device 20 is fabricated by the method described above, however, it has been found that the lower surface of the aperture portion 21 is fouled by impurities and damaged when removing the conductive layer 308 by the RIE method in the step of FIG. 7N. FIG. 19 is an electron micrograph showing the lower surface of such an aperture portion 21. As is clear from this photograph, a multiplicity of areas having irregular defects are observed in addition to the apertures having a rectangular section corresponding to the apertures 303A, 303B. These defects are considered to be derived from a fluoride formed by reaction between $CF_4$ used as an etching gas and $SiO_2$ used as a specimen holder of the etching apparatus in the RIE process of TaMo in the step of FIG. 7N.

The foregoing is the description of a conventional method of fabricating a BAA device. The conventional method has the problem that the lower surface of the aperture portion is damaged as described above. This problem is obviated by an embodiment of the present invention described below.

The method of fabricating a BAA device according to an embodiment of the invention is identical to the conventional method up to the step of FIG. 7L from the step of FIG. 7A. These steps, therefore, will not be explained.

Figure 9A:
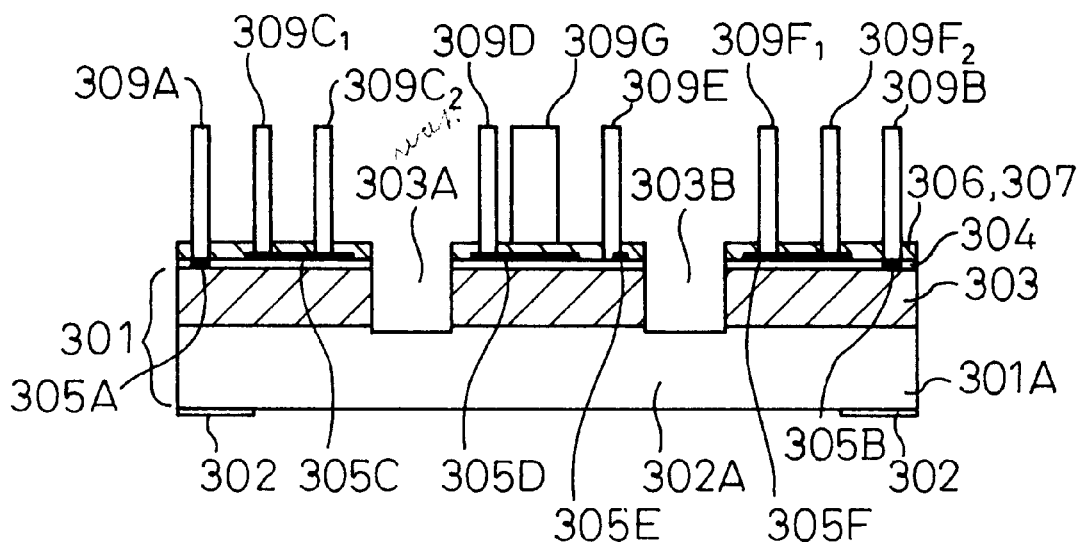
FIGS. 9A and 9B are diagrams showing the steps of fabricating a BAA device according to this invention.
Figure 9B:
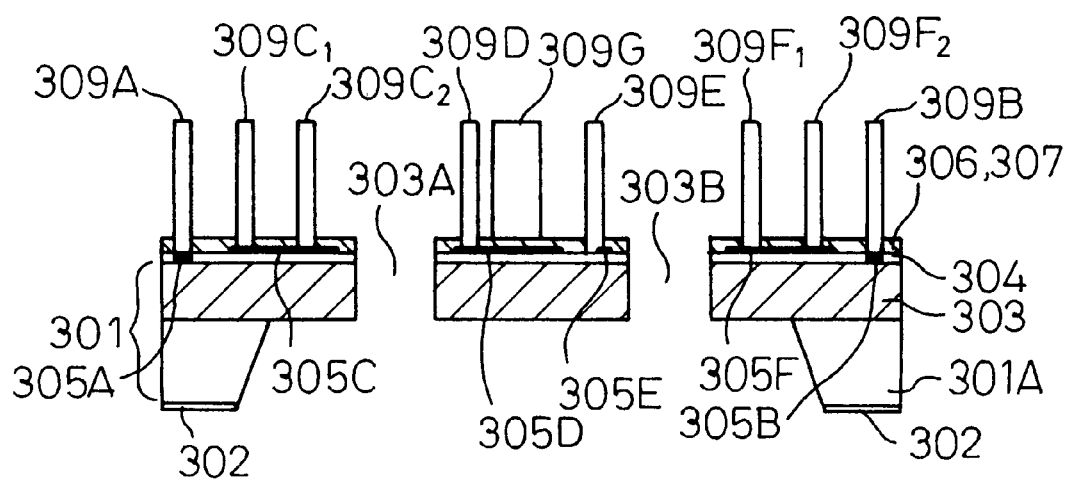

FIGS. 9A and 9B are diagrams for explaining the final process in the embodiment of the invention.

According to this embodiment, in the step of FIG. 9A, the substrate of FIG. 7L is held on a specimen table of an ion milling apparatus and the conductive layer 308 is removed by ion milling. The ion milling of the conductive layer 308 is at least several times more efficient than RIE, and can accurately remove the conductive layer 308. Then, the substrate is held in a protective jig and the reverse side thereof wet etched. As shown in FIG. 9B, the portion of the Si substrate 301 exposed by the aperture 302A of the underlying thermal oxide $SiO_2$ film is removed.

Figure 10A:
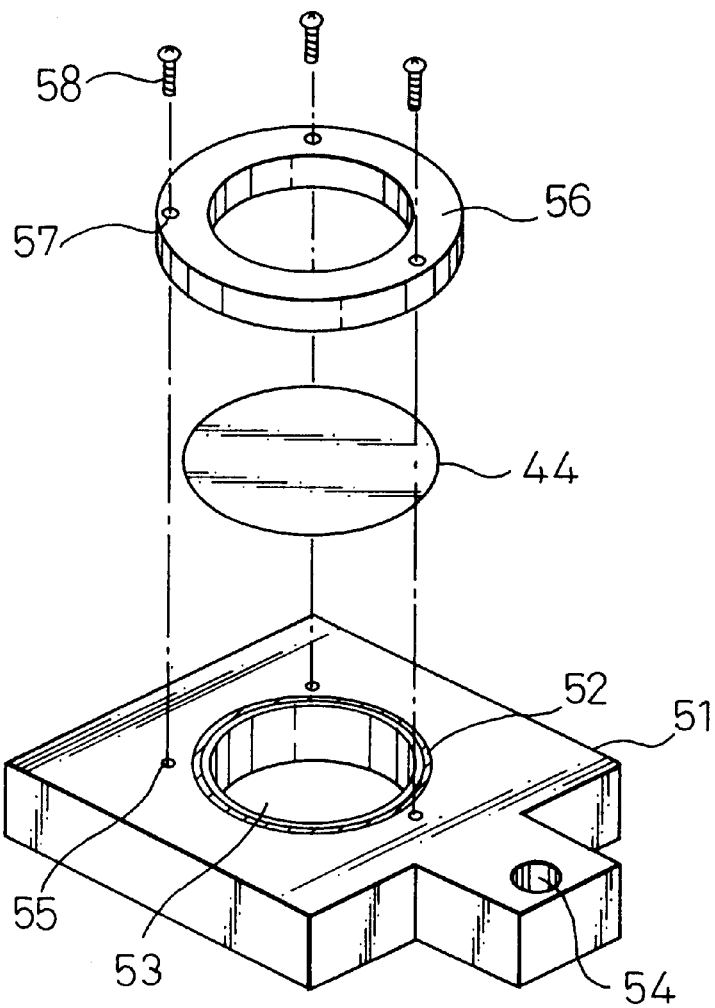
FIGS. 10A and 10B are diagrams showing a jig used in the wet etching process for fabricating a BAA device according to this invention.
Figure 10B:
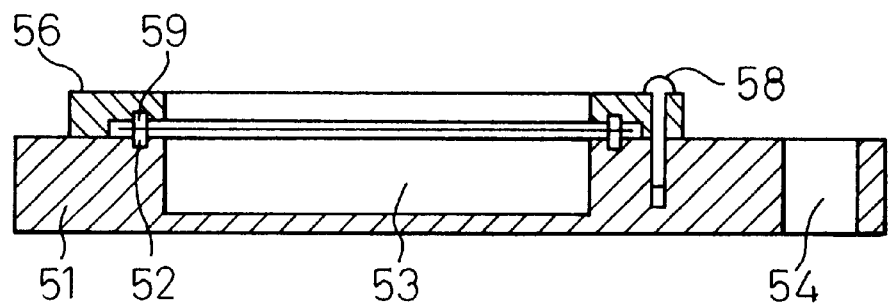

FIG. 10A is a perspective view for explaining the mechanism of the protective jig used in the step of FIG. 9B. FIG. 10B is a sectional view showing a wafer mounted. As shown, the protective jig 51 has a cylindrical hole 53 around which an O-ring 52 is mounted. The wafer 44 is placed on the protective jig 51 in such a position that the non-etched surface thereof faces the cylindrical hole 53. A holder 56 having a O-ring 59 thereunder is placed on the wafer 44 and fixed with screws 58. A hole 54 is for suspending the protective jig 51. With the wafer 44 mounted as shown in FIG. 10B, the lower surface of the wafer 44 faces the cylindrical hole 53, which is hermetically sealed by the protective jig 51, the wafer 44 and the O-ring 52.

Figure 11:
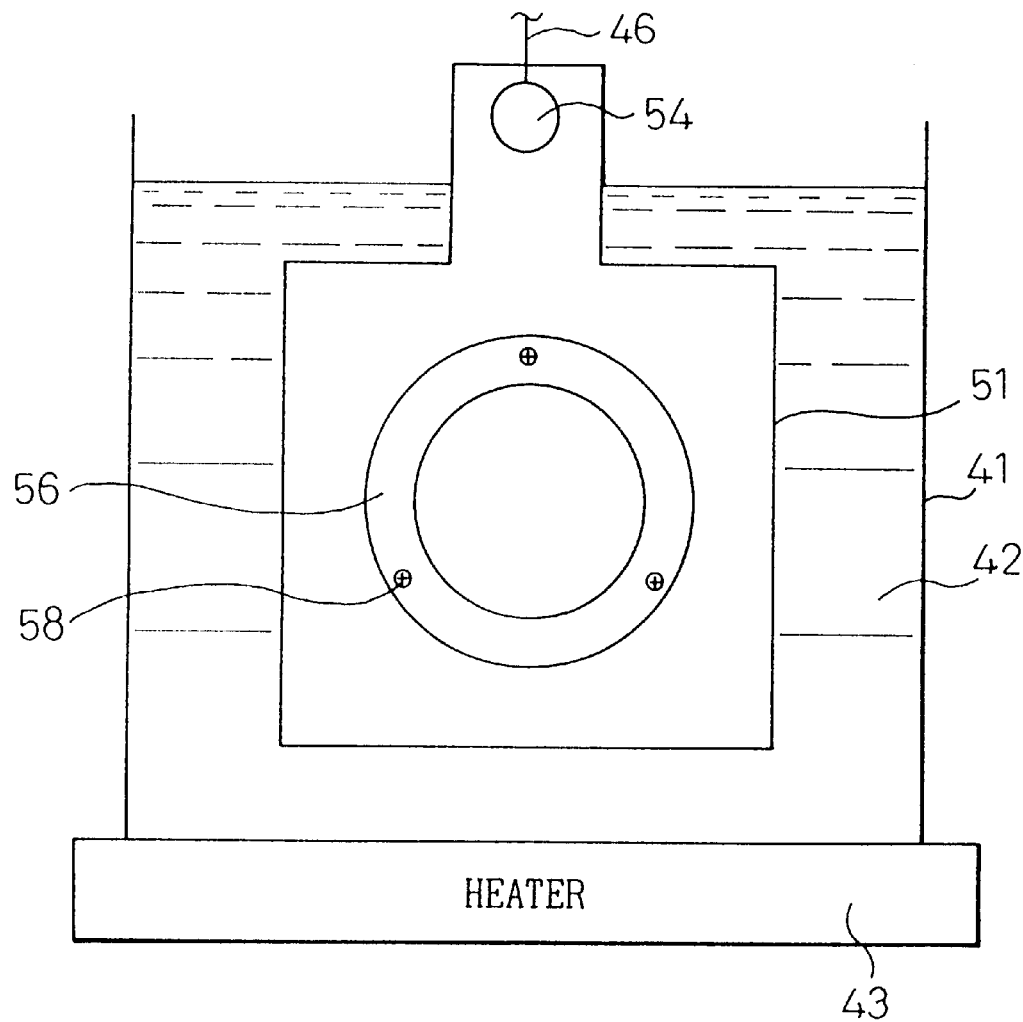
FIG. 11 is a diagram showing a wet etching apparatus.

FIG. 11 shows the state in which the protective jig 51 with the wafer 44 mounted thereon is suspended by a wire 46 and dipped (immersed) in the etching solution 42 in an etching bath 41. In the state of FIG. 11, one surface of the wafer 44 is in contact with the etching solution 42, while the other surface thereof is out of contact with the etching solution 42 as it faces the spacing of the hermetically-sealed cylindrical hole 53 of the protective jig 51. The wafer 44, therefore, as far as it is held in the state of FIG. 11, has only one surface thereof etched without affecting the other surface which is out of contact with the etching solution.

The wet etching process executed in the manner shown in FIG. 11 removes the non-doped layer 301A in the Si substrate 301 having the structure of FIG. 9B from the aperture 302A, thereby forming apertures corresponding to the recesses 303A, 303B in the aperture portion 21. In this wet etching process, the region of the Si substrate 301 formed with the deflection electrodes 309A, 309, and so on, of the electrostatic deflector is protected in the hermetically-sealed recesses of the protective jig. Even after the conductive layer 308 is removed in the step of FIG. 9A, therefore, the problem of the dielectric films 306, 307 being damaged is not posed.

By the way, the RIE method, though lower in efficiency, can be used in place of the ion milling method for removing the conductive layer 308. Also, the ICP (inductively-coupled plasma) method can be used.

The conductive layer 308 is not limited to the one having a TaMo/Au/TaMo structure but can use another metal material. Further, in the wet etching process, KOH instead of EPW can be used as an etching solution.

In the case where an etching solution is heated and used at a considerably higher temperature than room temperature in order to improve the etching rate for an etching apparatus shown in FIG. 11, the problem of the wafer 44 being broken is posed when the protective jig 41 with the wafer 44 mounted thereon is taken out from or placed into the etching solution 42. This is considered due to the considerable change in the internal air pressure of the hermetically-sealed spacing caused by sudden expansion and contraction of the air therein. The temperature of the etching solution is about 112° C., for example. With the increase from room temperature of 23° C. to the etching solution temperature of about 112° C., the pressure in the hermetically-sealed spacing in the cylindrical hole 33 increases about six times higher according to Boyle-Charles' law. As a result, a large force is exerted on the surface of the wafer, leading to the breakage of the wafer. The breakage of the wafer correspondingly reduces the yield.

In view of this, the wet etching apparatus of FIG. 11 has been improved in the manner described below.

Figure 12A:
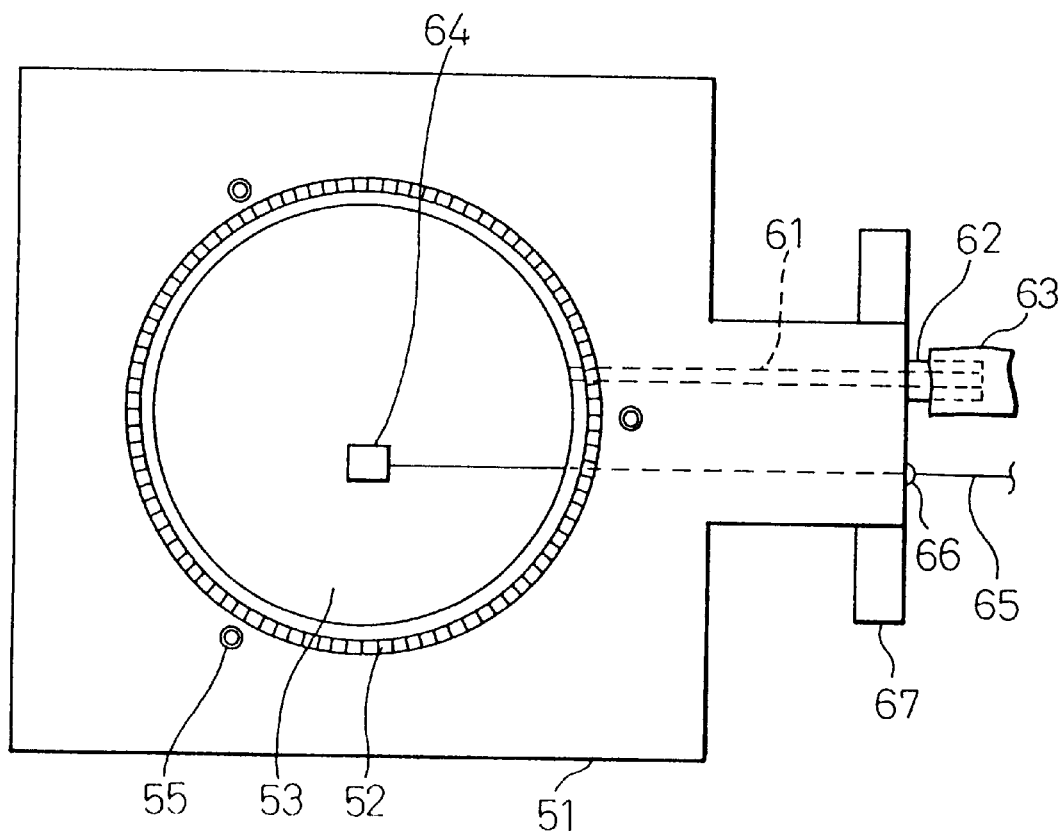
FIGS. 12A and 12B are diagrams showing another jig used for the wet etching process according to this invention.
Figure 12B:
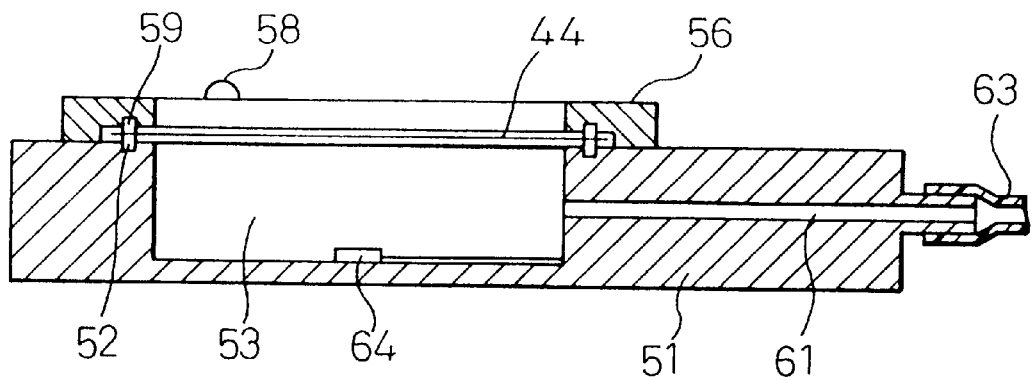

FIG. 12A is a diagram showing a structure of the protective jig according to a first improvement. FIG. 12B is a sectional view showing the wafer mounted in the protective jig. In this improvement, the mechanism shown in FIG. 11 is configured to include a duct 61 formed in the protective jig 41 for connecting the spacing of the cylindrical hole 43 with the atmosphere and a pressure sensor 64 arranged on the bottom of the cylindrical hole 43. A pipe 62 is protruded from the forward end of the duct 61 and connected with a flexible pipe 63 of rubber or the like. The pressure sensor 64 is connected with a signal cable 65 led out to the atmosphere, and a seal 66 is inserted between the signal cable 65 and the protective jig 41. Reference numeral 67 designates a portion by way of which the protective jig 41 is suspended. The protective jig 41, etc. are made of stainless steel or Teflon (trade name) which are not etched with the etching solution involved.

Figure 13:
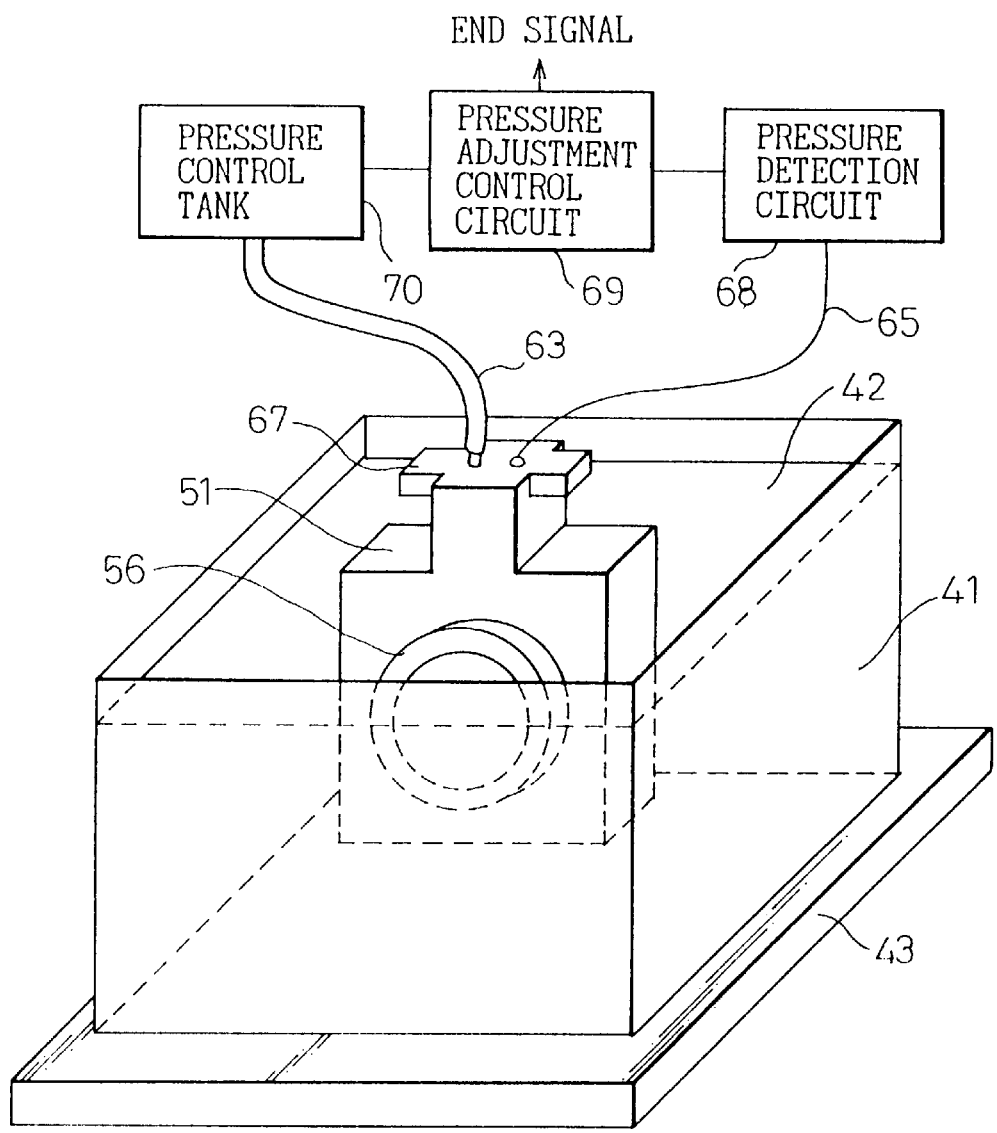
FIG. 13 is a diagram showing a configuration of a wet etching apparatus using the jig of FIGS. 12A and 12B.
Figure 14:
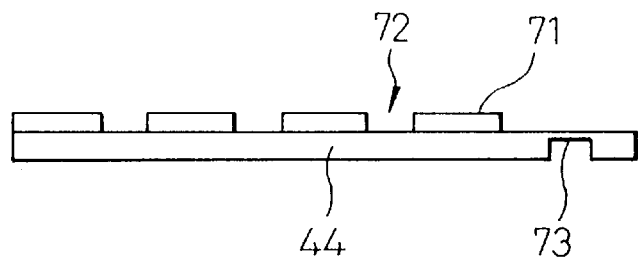
FIG. 14 is a diagram for explaining the etching process for the apparatus of FIG. 13.

FIG. 13 shows the protective jig 51 of FIG. 12B dipped in an etching bath 41 containing the etching solution 42. According to this embodiment, the Si wafer 44 is subjected to anisotropic wet etching with an etching solution consisting of a mixture of ethylenediamine, catechol and water. AS shown in FIG. 14, the non-etched portion of the surface of the Si wafer 44 to be etched is formed with a thermal oxide film 71 to the thickness of 700 nm and patterned by lithography and RIE. The etching process is carried out by dipping Si of about 50 μm for 5 to 6 hours in the etching solution 12 heated to 112° C.

As shown in FIG. 13, the present embodiment includes a pressure detection circuit 68, a pressure adjustment control circuit 69, and a pressure control tank 70. The pressure sensor 64 outputs an electrical signal changing in accordance with the internal pressure of the enclosed spacing to a signal cable 65. The pressure detection circuit 68 processes the electrical signal received from the pressure sensor 64 through the signal cable 65, and outputs a signal corresponding to the internal pressure of the enclosed spacing to the pressure adjustment control circuit 69. The pressure control tank 70 includes a pump for increasing the internal pressure of the tank by pressurizing the gas such as air or nitrogen and a valve for reducing the pressure by discharging the gas from the tank into the atmosphere, so that the internal gas pressure of the tank can be adjusted in accordance with the control signal of the pressure adjustment control circuit 69. The tank is connected to the enclosed space of the cylindrical hole 53 through a tube 63, and therefore the pressure can be adjusted in the enclosed spacing of the cylindrical hole 53. The pressure adjustment control circuit 69 adjusts the pressure of the pressure control tank 70 in accordance with the signal output from the pressure detection circuit 68 and controls the internal pressure of the enclosed spacing of the cylindrical hole 53 to a predetermined value. Assuming that the temperature difference between the room temperature and the etching solution 42 is about 100° C., as mentioned above, for example, and that the protective jig 51 with the wafer 44 mounted thereon is inserted in the etching solution 42, the internal pressure of the enclosed spacing of the cylindrical hole 53 is increased to six times as high. According to this embodiment, however, the increase in the internal pressure of the enclosed spacing is detected by the pressure sensor 64, and in accordance with it, the gas pressure in the tank is adjusted. In this way, the internal pressure of the enclosed spacing can be held at the initial pressure before dipping in the etching solution. Thus, the wafer can be prevented from breaking under an increased pressure thereby making it possible to carry out the Si etching process in satisfactory manner. The internal pressure of the enclosed spacing can also be set to an arbitrary level other than the initial pressure. For example, it may be set to a value slightly higher than the pressure exerted on the surface of the wafer 44 when the protective jig 51 is dipped in the etching solution 42.

When the holes 72 not formed with the thermal oxide film 71 are cut into through holes with the progress of etching, the gas gushes out of the enclosed spacing and the internal pressure of the enclosed spacing sharply drops. The pressure adjustment control circuit 69, which constantly monitors the detected pressure, generates an etching end signal when a pressure drop of more than a predetermined value occurs in a short time. The internal pressure of the enclosed spacing is set to a slightly higher level than the pressure of the etching solution, and therefore the etching solution is kept away from the enclosed spacing in spite of the fact that the through holes are formed. Alternatively, an arrangement can be made to increase the pressure of the pressure control tank 70 upon detection of a sharp pressure drop.

The etching does not necessarily proceed at uniform rate over the entire wafer surface and therefore the over etching is required. The over etching time is determined by the etching rate or the like and is normally 5 to 10 minutes. In this way, this control operation can prevent a shortage of etching or an excessive over etching and assure accurate etching.

According to the first embodiment, the process is executed for forming through holes in the Si wafer. As described above, therefore, the through holes are opened and the pressure in the enclosed spacing sharply drops at the time point when the etching proceeds by a desired amount. In the wet etching in general, however, it is not necessarily a general practice to form through holes. Explanation will be given of a method for detecting the progress of etching also in such a case.

Figure 15A:
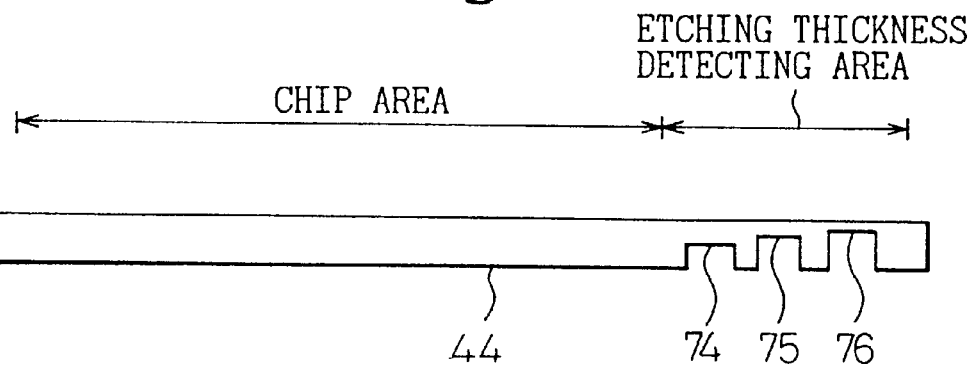
FIGS. 15A and 15B are diagrams showing a wafer used for detecting the progress of wet etching when no through hole is formed.
Figure 15B:
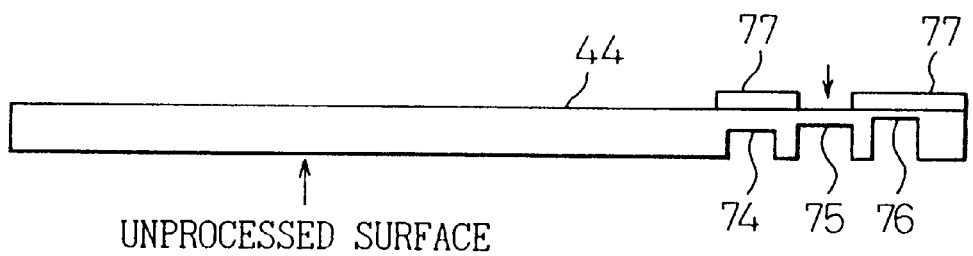

In a first method, as shown in FIG. 15A, a plurality of holes 74 to 76 are formed in a region of the Si wafer 44 not formed with semiconductor chips. The portions of the Si wafer 44 formed with the holes assume a plurality of different thicknesses approximate to the etching thickness. Before starting the etching process, as shown in FIG. 15B, a thermal oxide film 77 is formed on each of the hole portions of the etching thickness or slightly thicker than the etching thickness. These thermal oxide films 77 are formed simultaneously with the thermal oxide films 71 for patterning the chip. The wafer 44 is etched, and when through holes are formed in the hole portions not formed with the thermal oxide film 77 with the progress of etching, the gas gushes out of the enclosed spacing and the internal pressure of the enclosed spacing sharply drops. The resulting reduced pressure is detected. In the case where the over etching is required as described above, a hole thicker than the etching thickness by an amount corresponding to the over etching is selected.

Figure 16:
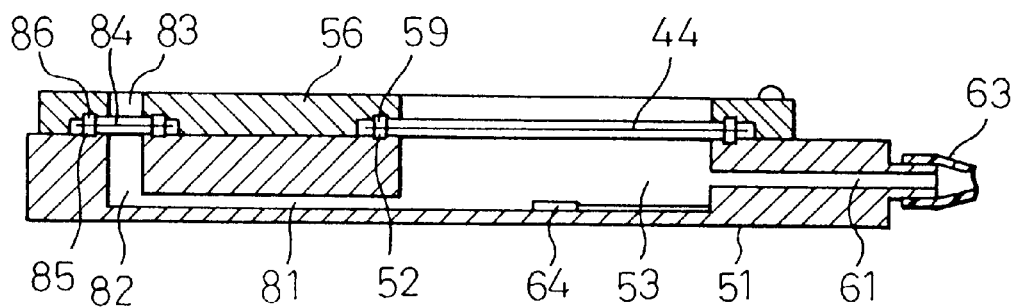
FIG. 16 is a diagram showing another mechanism for detecting the progress of wet etching when no through hole is formed.

According to a second method, a dedicated wafer is used for detecting the progress of etching. As shown in FIG. 16, a second cylindrical hole 82 is formed in the protective jig 51, and a duct 81 is formed for connecting the cylindrical hole 53 and the cylindrical hole 82 to each other. An O-ring 85 is arranged around the cylindrical hole 82, an aperture 83 is formed in the holder 56 in a way facing the cylindrical hole 82. An O-ring 86 is arranged around the aperture 83. A Si wafer 84 is mounted to detect the progress of etching. The Si wafer 84 is formed with a hole of predetermined thickness and is available in a variety of thicknesses. When conducting the etching process, the Si wafer 44 is set at the same time as selecting and setting the Si wafer 84 having a hole portion of appropriate thickness corresponding to the etching thickness, followed by dripping it in the etching solution. Once a through hole is formed in the wafer 84 with the progress of etching, the internal pressure of the enclosed spacing sharply drops as in the preceding case. By the way, the pressure sensor 64 can alternatively be disposed in the portion of the cylindrical hole 82.

Without detecting the progress of etching as described above, the time of the etching process can of course be set based on the etching rate.

In the first improvement, the pressure in the enclosed spacing is detected and controlled by feedback. The breakage of the wafer can also be prevented, however, simply by holding the interior of the enclosed spacing at a predetermined pressure, e.g. the outside pressure of the etching bath. The second improvement represents an example in which the interior of the enclosed spacing is kept at the atmospheric pressure.

Figure 17:
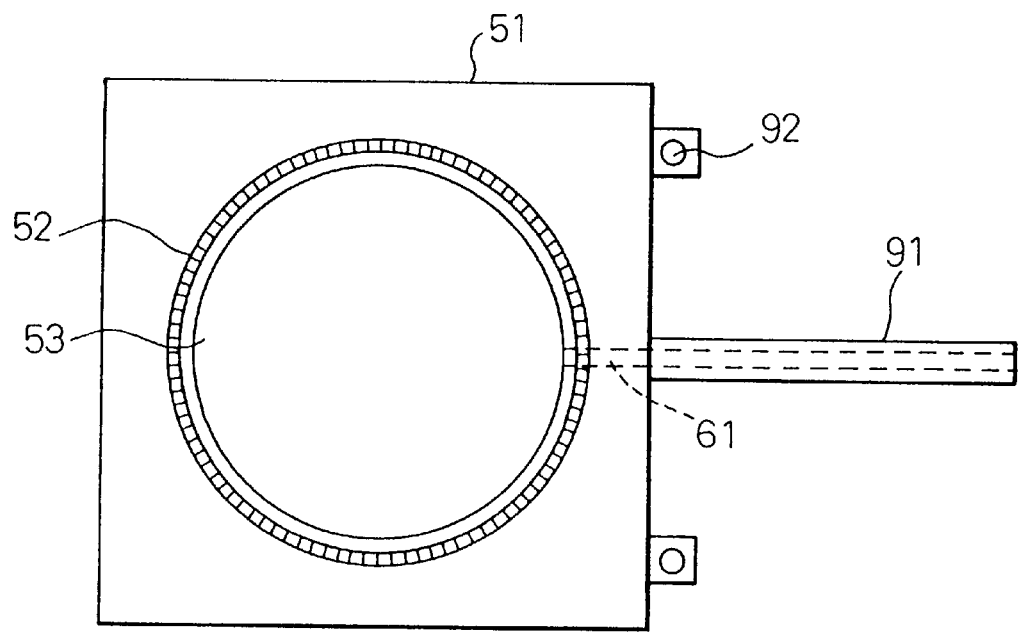
FIG. 17 is a diagram showing another jig used in the wet etching method according to the invention.
Figure 18:
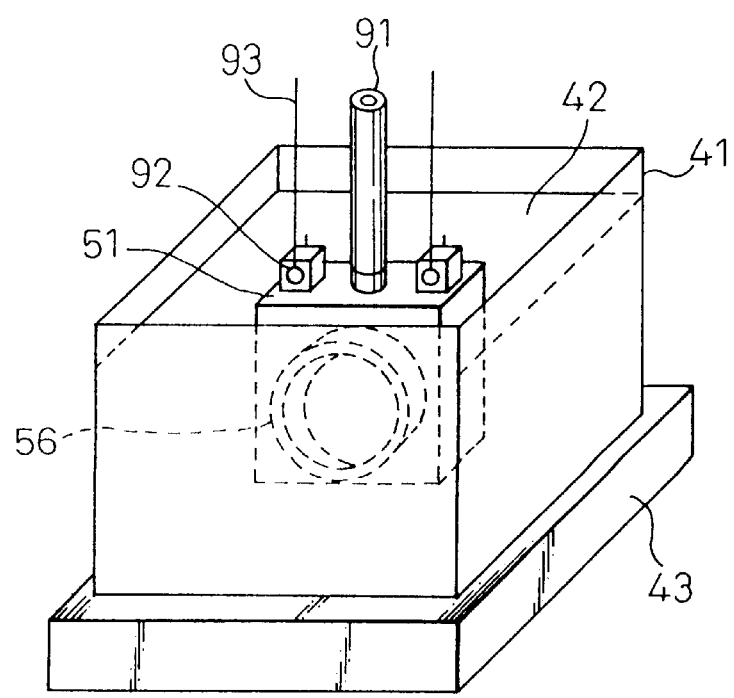
FIG. 18 is a diagram showing the manner in which the etching is being carried out using the jig of FIG. 17.

FIG. 17 is a diagram showing a protective jig 51 according to the second improvement. As shown, the protective jig 51 according to the second improvement includes a protruded portion 91 through which the duct 61 connected to the cylindrical hole 53 is opened to the atmosphere. A wafer is mounted on the protective jig 51 shown in FIG. 17 as in the first improvement, and as shown in FIG. 18, the protective jig 51 is dipped in the etching solution 42 with wires 93 held in holes 92. The forward end of the protruded portion 91 extends outside of the etching solution 42. Therefore, the enclosed spacing formed by the cylindrical hole 53 of the protective jig 51 and the wafer is connected with the external spacing. Thus, the internal pressure of the enclosed spacing is kept at the same level as the external spacing. Even in the case where the temperature of the enclosed spacing undergoes a sharp change as the protective jig 51 is moved into and out of the etching solution 42, therefore, the internal pressure of the enclosed spacing is kept at the same constant level as the external spacing. Thus, the wafer is not broken.

Improvements of the invention are described above. The present invention is applicable to any type of wet etching on only one side of a wafer.

It will thus be understood from the foregoing description that a wet etching method and apparatus according to the present invention can prevent the breakage of the semiconductor substrate (wafer) at the time of wet etching. Also, since the ending time point of the wet etching process is definitely determined, the damage to the non-etched surface which otherwise might be caused by the shortage of etching or an excessive over etching can be prevented. Further, even in the case where an over etching is protracted, the etching solution is kept off from the enclosed spacing and therefore the non-etched surface is not adversely affected. Thus, the yield and quality of the wet etching are improved, which in turn improves the quality of the semiconductor device for an improved yield of the process of semiconductor fabrication.

What is claimed is:

1. A method of fabricating an aperture array substrate formed with a plurality of apertures in an array and a plurality of electrostatic deflectors corresponding to said apertures, respectively, comprising the steps of:

forming a wire pattern on said substrate;

forming a dielectric film on said substrate in such a manner as to cover said wiring pattern;

forming a plurality of recesses in said substrate corresponding to a plurality of said apertures, respectively;

forming a plurality of contact holes for exposing said wiring pattern in said dielectric film adjacently to a plurality of said recesses, respectively;

depositing a conductive film pattern on said dielectric film in such a manner as to contain a plurality of said contact holes;

forming the electrodes of said electrostatic deflectors electrically connected to said wiring pattern by plating with said conductive film pattern as an electrode in a plurality of the respective contact holes;

removing said conductive film; and then removing a portion of the reverse side, opposite from said electrodes, of said substrate to a predetermined position by wet etching while protecting from said wet etching said substrate other than said portion of said reverse side.

2. A method according to claim 1, wherein said wet etching step is executed by holding said substrate in a protective jig for covering said substrate other than said portion of said reverse side while dipping said substrate in an etching solution.

3. A method according to claim 2, wherein said protective jig includes a body portion having at least a recess, said substrate is mounted in such a manner that said. dielectric films face said recesses of said protective jig and said recesses are hermetically sealed, thereby covering said substrate other than said reverse portion.

4. A method according to claim 3, wherein said protective jig includes a seal member arranged along the edge portion of each of said recesses for surrounding said recesses, respectively, and a holding member having apertures for exposing a portion of said reverse side, said holding member being engaged with said body portion with said substrate pressed against said seal member.

5. A method according to claim 1, wherein said step of removing said conductive film is executed. by the ion milling method.

6. A method according to claim 1, wherein said substrate is a silicon substrate.

7. A method according to claim 1, wherein said aperture array substrate is a blanking aperture array used for an electron beam exposure apparatus.

* * * * *